(12) United States Patent
Kimura et al.

(10) Patent No.: US 6,489,903 B2
(45) Date of Patent: Dec. 3, 2002

(54) DATA ENCODING METHOD, DATA ENCODING APPARATUS, DATA DECODING METHOD, AND DATA DECODING APPARATUS

(75) Inventors: Tomohiro Kimura; Ikuro Ueno; Masayuki Yoshida, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/922,853

(22) Filed: Aug. 7, 2001

(65) Prior Publication Data

US 2002/0030614 A1 Mar. 14, 2002

(30) Foreign Application Priority Data

Sep. 12, 2000 (JP) ........................................ 2000-275842

(51) Int. Cl.[7] ................................................ H03M 7/00
(52) U.S. Cl. ...................... 341/107; 371/37.01; 375/240
(58) Field of Search ............................ 341/107, 87, 94, 341/67, 60, 61, 106

(56) References Cited

U.S. PATENT DOCUMENTS 5,440,345 A * 8/1995 Shimoda ...................... 348/411
5,699,128 A * 12/1997 Hayashi ....................... 348/699
5,781,561 A * 7/1998 Machida et al. ........... 371/37.01
6,343,153 B1 * 1/2002 Kawasaki et al. ............ 382/239

OTHER PUBLICATIONS

ITU–T Recommendation T.82, 6.8 Arithmetic Coding pp. 26–45.

* cited by examiner

Primary Examiner—Brian Young
Assistant Examiner—John Nguyen

(57) ABSTRACT

An encoding/decoding method for predicting appearance probability of an information source symbol, while learning, and for dividing a valid section on a numerical straight line into both a first partial section to which an approximate value of the above-mentioned prediction appearance probability is applied and a second partial section remained in the valid section, to which such an arithmetic code is applied, the arithmetic code setting a partial section corresponding to an appearing symbol as a new valid section, is operated by storing thereinto such a fact that the prediction appearance probability is a specific value; by judging that the prediction appearance probability is equal to the specific value by referring to the relevant specific value; and by correcting an allocation between the first partial section and the second partial section when the judgement operation judges that the prediction appearance probability is equal to the specific value.

26 Claims, 30 Drawing Sheets

FIG. 12

| STATE | PROBABILITY | LSZ | NMPS | NLPS | SWTCH |
|---|---|---|---|---|---|
| 0 | 0.50 | 0.475 | 1 | 0 | 1 |
| 1 | 0.45 | 0.425 | 2 | 0 | 0 |
| 2 | 0.40 | 0.375 | 3 | 1 | 0 |
| 3 | 0.35 | 0.325 | 4 | 2 | 0 |
| 4 | 0.30 | 0.275 | 5 | 3 | 0 |
| 5 | 0.25 | 0.225 | 6 | 4 | 2 |
| 6 | 0.20 | 0.175 | 7 | 5 | 0 |
| 7 | 0.15 | 0.125 | 8 | 6 | 0 |
| 8 | 0.10 | 0.075 | 9 | 7 | 0 |
| 9 | 0.05 | 0.025 | 9 | 8 | 0 |

| $i$ | $2^{-n}$ | $f(2^{-n})$ | $i+1$ | $i-1$ | $n$ |

FIG. 18
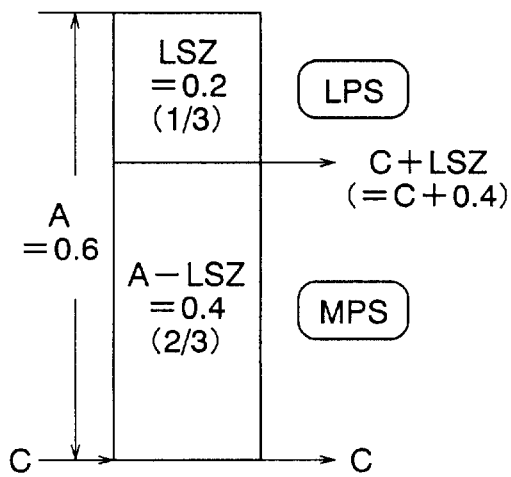
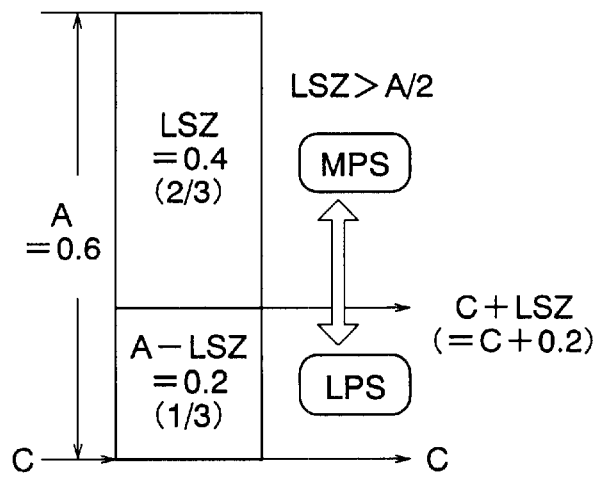

FIG. 21

| STATE | PROBABILITY | LSZ | NMPS | NLPS | SWTCH |
|---|---|---|---|---|---|
| 0 | 0.50 | 0.475 | 1 | 0 | 1 |
| 1 | 0.45 | 0.425 | 2 | 0 | 0 |
| 2 | 0.40 | 0.375 | 3 | 1 | 0 |
| 3 | 0.35 | 0.325 | 4 | 2 | 0 |
| 4 | 0.30 | 0.275 | 5 | 3 | 0 |
| 5 | 0.25 | 0.225 | 6 | 4 | 0 |
| 6 | 0.20 | 0.175 | 7 | 5 | 0 |
| 7 | 0.15 | 0.125 | 8 | 6 | 0 |
| 8 | 0.10 | 0.075 | 9 | 7 | 0 |
| 9 | 0.05 | 0.025 | 9 | 8 | 0 |

DATA ENCODING METHOD, DATA ENCODING APPARATUS, DATA DECODING METHOD, AND DATA DECODING APPARATUS

BACKGROUND OF THE INVENTION

1. Field of the Invention

The present invention is related to an encoding method, an encoding apparatus, a decoding method, and also a decoding apparatus, capable of compressing/decompressing data.

2. Description of the Related Art

As an example of known encoding systems, a description will be made of an arithmetic encoding operation capable of achieving a high compression rate. Before describing a concrete operation, a conceptional idea of a binary arithmetic encoding operation is explained with reference to FIG. 16. An arithmetic encoding operation is realized in such a manner that a coordinate system value of a binary decimal number on a numerical straight line defined larger than, or equal to 0.0 and smaller than 1.0 becomes a code C. In a process stage, a range defined on the above-explained numerical straight line is divided as a valid section (effective section) width A in direct proportion to an appearance probability of a binary symbol, and a partial section corresponding to an actually appearing symbol is divided as a new valid section, which is repeatedly carried out. MPS (More Probable Symbol) corresponds to a superior symbol which indicates a data value of higher appearance probability. LPS (Less Probable Symbol) corresponds to an inferior symbol which indicates a data value of lower appearance probability. One coordinate value which is updated by a final symbol within a valid section is outputted as a code. During process operation, the code C is calculated as a lower bound value of a valid section, and this code C is updated as well as a width of a valid section, which is equal to a difference between an upper bound value and a lower bound value in this drawing. As the final code, it is also possible to select a coordinate value where a significant digit number is minimum within a valid section where 0 subsequent to a tail of a coordinate system is cut off.

In general, to practically execute the arithmetic encoding operation, a subtraction type arithmetic encoding operation is employed which is adaptive to cope with an increase in a significant digit number when a code calculation is carried out. It is assumed in the below-mentioned description that an arithmetic code indicates a subtraction type arithmetic code. FIG. 17 is a diagram for representing a conceptional idea of a subtraction type arithmetic encoding operation and a conceptional idea of a renormalizing process operation. A symbol LSZ corresponds to a partial section allocated to LPS, and an approximate value is selected from a previously prepared table based upon appearance probability of the symbols. In this step, when the valid section becomes smaller than ½, such a renormalizing process operation is carried out that the valid section is multiplied by power of 2 so as to be enlarged larger than, or equal to ½. As a consequence, a digit number of a decimal portion is kept constant during a calculation. At this time, in an integer portion, these digits which constitutes '1' subsequent to a decimal point and '0' of an upper digit of this '1', may be changed by a carry-up propagation in a coordinate calculation which will be performed later. Thus, the values are not defined. Since digits upper than these values do not contain the carry-up propagation, these upper digits can be sent out from an encoder.

Both the most typical encoder (Encoder) of the subtraction type arithmetic encoding operation and also the most typical decoder (Decoder) thereof may be realized by employing the table and the process flow, which are described in the International Standard Recommendation T. 82 of ITU-T. Here, this arithmetic encoding operation will the be referred to as a QM coder, and while data to be encoded is used as a binary image, the calculation process operations of both the encoding operation and the decoding operation defined in the above-explained preceding technical publication will now be described. In this case, when the encoding calculation process operation and the decoding calculation process operation of the QM coder are carried out, the correcting techniques for partial sections corresponding to the symbols disclosed in Japanese Patent No. 2128115 (U.S. Pat. Nos. 5,307,062, 5,404,140) are employed. This correcting technique will be explained with reference to FIG. 18, in which numeral values are expressed by the decimal system. In FIG. 18($a$), while the valid section is 0.6, 0.2 is selected as LSZ which may occupy ⅓ of the entire section. Since this LSZ is not larger than ½, LSZ is allocated to LPS, and the remaining section is allocated to MPS. However, as shown in FIG. 18($b$), when LSZ may occupy ⅔ of the entire section, which exceeds ½ thereof, since the symbol correspondences between the appearance probability rate and the actual occupation rate are inversed, the correction is performed by simply exchanging the sections by both MPS and LPS so as to suppress deterioration of the encoding performance. This is referred to as an "conditional MPS/LPS exchange".

FIG. 19 and FIG. 20 respectively represent block structural diagrams of an encoder 1A and a decoder 1B of QM coder, which are provided to explain operations with respect to both the encoding calculation process operation and the decoding calculation process operation. In this prior art, both an image memories 5A and 5B are assumed to be arranged inside the encoder 1A and the decoder 1B, respectively.

In FIG. 19 and FIG. 20, reference numeral 2 shows a context (Context), reference numeral 3 indicates a pixel (Pixel) which should be encoded, reference numeral 4 represents a code, and reference numerals 5A and 5B are image memories. Reference numeral 7 shows a prediction value table MPS, reference numeral 8 indicates a state table ST, reference numeral 9 represents an LPS section width table LSZ, reference numeral 10 shows an MPS state transition destination table NMPS, reference numeral 11 denotes an LPS state transition destination table NLPS, reference numeral 12 shows a prediction value inversion judgement table SWTCH, reference numerals 13A and 13B show arithmetic encoders, reference numeral 14 represents a symbol, and also reference numerals 15A and 15B represent pixel symbol converters.

Operations of the QM coder will now be explained. The image memory 5A employed in the QM encoder 1A stores thereinto an entered image 6, and refers to a predetermined encoded pixel by a model template with respect to the pixel 3 which should be encoded, and outputs the pixel 3 which should be encoded and the context 2 equal to a pattern produced from the pixel at the same time.

On the other hand, the image memory 5B employed in the QM decoder 1B stores therein the decode pixel 3 which has already been decoded, produces the context 2 with respect to such a pixel that should be decoded later from this stored pixel 3, and then outputs the produced context 2. The image memory 5B obtains such a pixel that should be decoded and is decoded by using this context to store thereinto this pixel which should be decoded, and then, outputs an image 6.

In the QM coder, prediction coincident probability of a pixel value is predicted in every context with respect to the pixel which should be encoded/decoded, and the encoding/decoding operations are executed, while the QM coder erans in connection with this variation. Learning is carried out by rewriting two variable tables 7 and 8 in which the context 2 is used as an index. One of these variable tables corresponds to a prediction value table MPS7 of each 1 bit (will be referred to as "MPS table 7" hereinafter) which stores thereinto as a prediction value in a state in which a pixel value MPS whose appearance probability is high. The other corresponds to a state table ST8 of each 7-bit (will be referred to as an "ST table 8" hereinafter) which stores thereinto state numbers (0 to 112). The state numbers are produced by classifying a degree of prediction coincidence probability of a prediction value into 113 pieces of states (State) in total.

Other than the variable tables 7 and 8, there are constant tables (probability prediction table) 9 to 12, while referring to state numbers (State) as an index when the encoding/decoding operations are carried out. In other words, these constant tables are an LPS section width table LSZ9 in which an LPS section width is expressed by 16 bits (will be referred to as an LSZ table 9 hereinafter), an MPS state transition destination table NMP10 in which an MPS transition destination is expressed by 7 bits (will be referred to as an NMPS table 10 hereinafter); an LPS state transition destination table NLPS11 in which an LPS transition destination is-expressed by 7 bits (will be referred to an NLPS table 11 hereinafter), and also a prediction value inversion judgement table SWTCH12 in which a prediction value inversion judgement is expressed by 1 bit (will be referred to as an SWTCH table 12 hereinafter). It is now assumed that the names of the alphabetical variable/constant tables indicated in this explanation are arrangement names employed in process flow operations (will be explained later).

The calculating units employed in the arithmetic encoder 13A/arithmetic decoder 13B refer to the LSZ table 9, and this LSZ table 9 is not directly related to learning of adaptive prediction. Inside the arithmetic encoder 13A/arithmetic decoder 13B, the calculation is carried out by employing the LSZ value, and when the calculation precision is lowered, the renormalizing process operation (Renormalization) is carried out. When this renormalizing process operation is carried out, learning is performed at the same time.

If the encoding/decoding symbol 14 when the renormalizing process operation is executed corresponds to a superior symbol, the NMPS value is written into the ST table 8, whereas if the encoding/decoding symbol 14 when the renormalizing process operation is executed corresponds to the inferior symbol, then the NLPS value is written in the ST table 8, and the state is updated. The superior symbol indicates that the pixels 3 to be encoded/decoded are equal to the prediction value MPS7, whereas the inferior symbol indicates that the pixels 3 to be encoded/decoded are not equal to the prediction value MPS7. When the encoding operation is carried out, the pixel symbol converter 15A outputs the symbol 14 to the arithmetic encoder 13A, whereas when the decoding operation is performed, the decoder 13B outputs the symbol 14 to the symbol pixel converter 15B.

Also, when the renormalizing process operation is caused by the inferior symbol, if the prediction coincidence probability thereof is substantially equal to ½, the MPS value 7 is inversed (calculation 1-MPS) and the inversed MPS value 7 is written into the MPS table 7. It can be judged as to whether or not the coincidence probability is equal to ½ by using the SWTCH value 12 as a flag.

As explained above, the updating process operation is carried out with respect to each of the two variable tables ST8 and MPS7, and these variable tables ST8/MPS7 must be separately managed.

In FIG. 21, there is shown an example of a constant table. While the constant table of the actual QM coder is constituted by 113 states, a description will now be made of a simple model. In this example, the constant table is constituted by 10 pieces of states, and it is assumed that the appearance probability of LPS between a state 0 to a state 9, is decreased by steps defined from 0.5 to 0.05. Under state i, when the renormalizing process operation is executed during the MPS process operation, the NMPS value is referred, and also the state number stored under the context is updated to (i+1). If i=9, this state cannot be further transferred to such a state having lower appearance probability than that of the own state 9, and therefore this state remains. Also, when the LPS process operation is carried out under state i, the NLPS value is referred, and the state number stored under the context is updated to (i−1). If i=0, this state cannot be further transferred to such a state having higher appearance probability than that of the own state "0", and therefore this state remains. At this time, since SWTCH=1, the prediction value MPS stored under the context is updated to an inversed value (1-MPS). In this case, it is ideal that LSZ is set to a probability value. However, since the valid section width is present between 0.5 and 1.0, LSZ is determined in such a manner that the errors caused by these aspects should be reduced as being permitted as possible. The constant table does not always contain the actual probability. In this drawing, an average value of the probability as to both the state i and the state (i+1) is simply described in this constant table.

FIG. 22 represents a bit arrangement of an encoding register C 30A, a bit arrangement of a decoding register C 30B, and a bit arrangement of a section width register A 31, which are used in both the encoding calculation process operation and the decoding calculation process operation. In the encoding register C 30A, a decimal point is set between a bit 15 and bit 16, a decimal part "x" (16 bits) corresponds to a calculating unit Cx32 based upon LSZ9, and when a carry is performed, this decimal part is propagated to an upper integer part. In the integral part, symbol "b" (8 bits) corresponds to a byte output unit Cb33, and symbol "c" (1 bit) corresponds to a carry-up judging unit Cc34. The carry-up is propagated to a code byte outputted just before the carry-up, and may be propagated up to an output byte before this code byte, if necessary. In the encoding process stage, the C register value is updated in such a manner that this C register value becomes as a code 4 a lower bound value of a section corresponding to the coded symbol.

In the decoding register C 30B, both a lower digit register CLOW 36 and a high digit register CHIGH 37 set a decimal point between a bit 23 and a bit 24; symbol "b" (8 bits) corresponds to Cb36 identical to a byte input unit (CLOW register 35); and symbol "x" (17 bits) corresponds to a calculating unit Cx (CHIGH register 37) 38 based upon LSZ9. In the decoding process stage, the C register value is updated in such a manner that this C register value becomes an offset value to a code 4 from a lower bound value of a section corresponding to the decoded symbol. This code 4 is a coordinate value within this section.

The input/output operations of the code byte in Cb are carried out when shift numbers of the C registers 30A, 30B, and the A register 31 by the renormalizing process operation are counted by CT50 equal to an auxiliary variable other than a register, and the counted value becomes 0. Both an initial value and a re-setting value of CT50 are equal to 8. As the encoding register defined in the preceding technical publication (recommendation T.82), there is a Cs between Cx and Cb, but is omitted for the sake of a simple explanation. If Cs is provided, a digit number thereof must be added to an initial value of a variable CT. Also, an integer part bit 24 of the encoding register is not defined, but is not required in this prior art. While the CLOW register 36 is defined by 16 bits, since lower-digit 8 bits lower than Cb are not used, the lower-digit 8 bits are omitted. The above-explained changes in the description never give any adverse influence to the encoding performance.

In the section width register A31 which is commonly used in both the encoding operation and the decoding operation, in correspondence with the decimal points of the encoding/decoding registers 30A/30B, "a" (16 bits) is arranged as a decimal part in conformity with an "x" register unit, and an integer part (bit 16) becomes "1" only by the value of an initial state. A section width (or, section size) is updated to either A-LSZ (lower section width) or LSZ (upper section width), and this section width is renormalized in such a manner that a bit 15 indicative of a ½ weight becomes "1" except for the initial value (integer part="1"). Since the section width is kept larger than, or equal ½, even when any LSZ9 is selected as the upper section width, securing of the lower section is guaranteed. In the renormalizing process operation, the A register 31, and the C register 30A, or 30B are enlarged at the same time.

In the QM coder, normally, the upper section LSZ9 which constitutes the fixed size with respect to the state is allocated to LPS. When the lower section becomes smaller than the upper section, "conditional MPS/LPS exchange" in which the upper section LSZ9 is allocated to MPS is carried out. The renormalizing process operation is necessarily carried out when LPS is encoded/decoded, and also MPS is encoded/decoded by applying "conditional MPS/LPS exchange".

First, the encoding calculation process operation will now be explained with reference to a concrete process flow operation.

When the encoding calculation process operation is commenced, an initial value of the C register 30A (see FIG. 22) is 0; an initial value of the A register 31 is 0x10000; and an initial value of an auxiliary variable CT50 becomes 8 based upon the specification of the above-explained C register. Also, both a prediction value MPS[CX]7 with respect to all of contexts (reference patterns) CX2 (FIG. 19), and an initial value of a state ST[CX]8 are assumed as 0. Then, when the coding calculation process operation is ended, a process operation of a definition for sweeping out the content of the encoding register 30A as a final code 4 is performed.

FIG. 23 is an encoding process (ENCODE) flow operation for switching a process operation called from coincidence/incoincidence between the pixel value 3 to be encoded and the prediction value 7. At a step S111, a judgement is made as to whether or not the pixel value PIX3 is made coincident with the prediction value MPS[CX]7. If the pixel value PIX3 is made coincident with the prediction value MPS[CX]7, then MPS is encoded, whereas if the pixel value PIX3 is not made coincident with the prediction value MPS[CX]7, LPS is encoded. At a step S112, while CODELPS (LPS encoding) is called, LPS is encoded. At a step S113, while CODEMPS (MPS encoding) is called, MPS is encoded.

FIG. 24 shows a CODELPS process flow operation called in such a case that the pixel value 3 to be encoded is not made coincident with the prediction value 7, namely, LPS is encoded. First, at a step S120, LSZ is assumed as LSZ [ST[CX]]. At a step S121, the value of the A register 31 is temporarily updated to the lower section width. When such a judgement is made at a step S122 that the LSZ value (upper section width) is larger than the A value (lower section width) (namely, the answer is "YES"), the "conditional MPS/LPS exchange" is applied, and while both the value of the A register 31 and the value of the C register 30A remain, the valid section is updated to a smaller lower section. When, the LSZ (upper section width) is smaller than, or equal to the A value (lower section width) (namely the answer is "NO"), the lower section width (present A register 31) is added to the C register 30A at a step S123, and thereafter, while the A register 31 is set as LSZ, the valid section is updated to a smaller upper section at a step S124. If it is judged at a step S125 that the constant SWTCH value 12 is equal to 1, then the prediction value 7 (MPS table) is inversed/updated at a step S126. While LPS is encoded, a state transition is performed with reference to the NLPS table 11 at a step S127, and RENORME is called to execute the renormalizing process operation at a step S128.

FIG. 25 represents a CODEMPS process flow operation called in such a case that the pixel value 3 to be encoded is made coincident with the prediction value 7, namely called when MPS is coded. First, at a step S130, LSZ is assumed as LSZ[ST[CX]]. At a step S131, the value of the A register 31 is temporarily updated to the lower section width. If it is judged at a step S132 that the value of the A register 31 is larger than, or equal to 0x8000 (namely, the answer is "NO"), then this CODEMPS process flow operation is ended. To the contrary, when the value of the A register 31 is smaller than 0x8000 (namely, the answer is "YES"), if it is so judged at a step S133 that the LSZ value (upper section width) is smaller than the A value (lower section width) (namely the answer is "YES"), then the "conditional MPS/LPS exchange" is applied. The lower section width (present A register 31) is added to the C register 30A at a step S134, and thereafter, while the A register 31 is set as LSZ, the valid section is updated to a larger upper section at a step S135. On the other hand, when it is judged at the step S133 that LSZ (upper section width) is larger than, or equal to the A value (low section width) (namely, the answer is "NO"), while both the value of the A register 31 and the value of the C register 30A remain, the valid section is updated to a larger lower section. While MPS is encoded, a state transition is performed with reference to the NMPS table 10 at a step S136, and RENORME is called to execute the renormalizing process operation at a step S137.

FIG. 26 indicates a RENORME process flow operation for performing the renormalizing process operation. At a step S141, the value of the A register 31 is shifted to a 1-bit upper digit, and at a step S142, the value of the C register 30A is shifted to a 1-bit upper digit, so that such a calculation is carried out that is equivalent to a multiplication by 2. At a step S143, 1 is subtracted from the variable CT50, and a judgment is made as to whether or not the variable CT50 is equal to 0 at a step S144. When the judgment result is "YES", the 1-byte code 4 is outputted from the C register 30A (Cb), and 8 is again set to the variable CT50 at a step S145. At a step S146, a judgment is made as to whether or not the renormalizing process operation is ended. If the value of the A register 31 is smaller than 0x8000, then the process operations defined from the step S141 to the step S145 are repeatedly carried out. If the value of the A register 31 is larger than, or equal to 0x8000, then the section becomes larger than, or equal to ½, and the process operation is ended.

When the 1-byte code 4 is outputted from the Cb register 33 at the step S145, the carry is judged by the Cc register 34, and the carry is propagated to the code byte which has already been outputted. Then, after the carry is propagated and the code byte is outputted, both the values of the Cb register 33 and the Cc register 34 are cleared.

Next, the decoding calculation process operation will now be described with reference to a concrete process flow operation.

When the decoding calculation process operation is commenced, the C register 30B inputs thereinto a 3-byte code from a decimal part bit 0 to bit 23 as an initial value, and an initial value of the A register 31 is equal to 0x10000. Also, while an initial value of the auxiliary variable CT50 is assumed as 8, both an initial value of the prediction value MPS [CX]7 and an initial value of the state ST[CX]8 with respect to all of the contexts (reference patterns) CX2 are assumed as 0.

FIG. 27 indicates a decoding process (DECODE) operation flow for decoding a pixel which should be decoded. First, at a step S220, LSZ is set to LSZ [ST [CX]]. At a step S221, the value of the A register 31 is temporarily updated to the lower section width. When it is so judged at a step S222 that the value of the code CHIGH register 37 is smaller than the value of the A register 31 (namely, the answer is "YES"), the lower section is decoded. Next, when it is so judged at a step S223 that the value of the A register 31 is smaller than 0x8000 (namely, the answer is the answer is "YES"), "MPS_EXCHANGE" is called at a step S224, and RENORMD is called at a step S225, so that the renormalizing process operation is carried out. On the other hand, when it is so judged at the step S223 that the value of the A register 31 is larger than, or equal to 0x8000 (namely, the answer is "NO"), MPS is decoded without executing the renormalizing process operation. At a step S226, the pixel value 3 is set to the prediction value 7, so that while both the value of the A register 31 and the value of the C register 30B remain, the valid section is updated to a larger lower section. Also, when it is so judged at the step S222 that the value of the code CHIGH register 37 is larger than, or equal to the value of the A register 31 (namely the answer is "NO"), the upper section is decoded. At a step S227, "LPS_EXCHANGE" is called, and also RENORMD is called at a step S228, so that the renormalizing process operation is carried out. In such a process path for calling both "MPS_EXCHANGE" and "LPS_EXCHANGE", even when the sections to be decoded are determined respectively, if the sections are not compared with each other, then it is not possible to judge as to whether the section to be decoded corresponds to MPS, or LPS. In the called process flow, the pixel value 3 to be decoded is determined.

FIG. 28 shows an LPS_EXCHANGE process flow operation for decoding an upper section. When it is so judged at a step S231 that an LSZ value (upper section width) is smaller than and A value (lower section width) (namely, the answer is "YES"), the conditional MPS/LPS exchange is applied. At a step S232, a lower section width (present A register 31) is subtracted from the CHIGH register 37, and thereafter, the A register 31 is set to LSZ at a step S233. At this time, since the upper section is larger than the lower section, MPS is decoded. At a step S234, the pixel value 3 is set as the prediction value 7. At a step S235, a state transition is carried out by referring to the NMPS table 10. When LSZ (upper section width) is larger than, or equal to the A value (lower section width) (namely, the answer is "NO"), a lower section width (present A register 31) is subtracted from the CHIGH register 37 at a step S236, and thereafter, the A register 31 is set to LSZ at a step S237. At this time, since the upper section is smaller than the lower section, LPS is decoded. At a step S238, the pixel value 3 is set as a non-prediction value (1-prediction value 7). When it is so judged at a step S239 that the constant SWTCH value 12 is equal to 1, the prediction value (MPS table) 7 is inversed/updated at a step S240. At a step S241, a state transition is carried out with reference to the NLPS table 11.

FIG. 29 shows an MPS_EXCHANGE process flow operation for decoding a lower section. When it is so judged at a step S251 that an LSZ value (upper section width) is smaller than an A value (lower section width) (namely, the answer is "YES"), the conditional MPS/LPS exchange is applied, and LPS is decoded. At a step S252, since the pixel value 3 is set to the non-prediction value (1-prediction value 7), while both the value of the A register 31 and the value of the C register 30B remain, the valid section is updated to a smaller lower section. Next, when it is so judged at a step S253 that the constant SWTCH value 12 is equal to 1, the prediction value (MPS table) 7 is inversed/updated at a step S254. At a step S255, a state transition is carried out with reference to the NLPS table 11. On the other hand, when it is judged at a step S251 that LSZ (upper section width) is larger than, or equal to the A value (lower section width) (namely, the answer is "NO"), MPS is decoded. At a step S256, the pixel value 3 is set to the prediction value 7. At a step S257, a state transition is carried out with reference to the NMPS table 10.

FIG. 30 indicates a RENORMD process operation for executing the renormalizing process operation. At a step S261, a check is made as to whether or not the variable CT50 is equal to 0. If the judgment result is "YES", then at a step s262 a 1-byte code 4 is inputted to the C register 30B (Cb), and 8 is again set to the variable CT50. At a step S263, the value of the A register 31 is shifted to a 1-bit upper digit, and at a step S264, the value of the C register 30B is shifted to a 1-bit upper digit, so that such a calculation is carried out which is equivalent to a multiplication by 2. At a step S265, 1 is subtracted from the variable CT50. At a step S266, a judgment is made as to whether or not the renormalizing process operation is ended. If the value of the A register 31 is smaller than 0x8000, then the process operations defined from the step S261 to the step S265 are repeatedly carried out. A judgment is made as to whether or not the variable CT50 is equal to 0 at a step S267. When the judgment result is "YES", the 1-byte code 4 is inputted to the C register 30B (Cb), and 8 is again set to the variable CT50 at a step S268.

It should be understood that in the above-described encoding calculation process operation and decoding calculation process operation, in accordance with the preceding technical publication (recommendation T.82) cited as the prior art, the above-mentioned steps S120, S130, and S220 are not described, but are directly described in the respective calculation formulae in the reference format of the LSZ table 9. In this case, for the sake of the below-mentioned descriptions according to the present invention, it is clearly indicated that an index ST [CX] may be consulted as a variable LSZ which is not indicated (namely, not table reference format) in a process flow operation.

In the known encoding method, encoding apparatus, decoding method, and also decoding apparatus, in such a case that the valid section is divided in the arithmetic encoding step and also the arithmetic decoding step, the fixed approximate value is allocated to the partial section irrespective of the valid section width. As a result, since the error contained in the occupation rate and the error contained in the predicted appearance probability of the symbol are increased, there is such a problem that the encoding efficiency is lowered.

SUMMARY OF THE INVENTION

The present invention has been made to solve this problem of the prior art, and has an object to provide a data encoding method, a data encoding apparatus, a data encoding method, and a data encoding apparatus, capable of improving an encoding efficiency by employing such a way that in a symbol of a probability for power of ½, while a correction is made in such a manner that an occupation rate of a valid section becomes a probability value, partial sections are allocated.

With the above objects in view, the encoding apparatus of the present invention for predicting appearance probability of an information source symbol, while learning, and for dividing a valid section on a numerical straight line into both a first partial section to which an approximate value of the prediction appearance probability is applied and a second partial section remained in the valid section, to which such an arithmetic code is applied, the arithmetic code setting a partial section corresponding to an appearing symbol as a new valid section, comprises storage means for storing thereinto such a fact that the prediction appearance probability is a specific value, judgement means for judging that the prediction appearance probability is equal to the specific value by referring to the specific value of the storage means, and correction means for correcting an allocation between the first partial section and the second partial section when the judgement means judges that the prediction appearance probability is equal to the specific value.

Also, one of the specific values stored in the storage means may be selected to be ½, and a series of calculation process operations executed in combination with updating of a predicable symbol value of the prediction appearance probability with respect to the relevant symbol may be independently constituted from a calculation process operation of an irrespective symbol.

In encoding operation applied to the relevant symbol, the correction means corrects the allocation, while assuming that both the first partial section and the second partial section are made equal to the valid section. The correction means is comprised of renormalizing means by which only a code is enlarged by executing either a 1-digit shifting process operation or a multiplication by 2 without changing the valid section, and thereafter, representation precision of the valid section is kept maximum by a procedure for calculating a code value, and code outputting means for outputting such a code which can be outputted after the code has been updated by the renormalizing means.

BRIEF DESCRIPTION OF THE DRAWINGS

For a better understanding of the present invention, reference is made of a detailed description in conjunction with the accompanying drawings, in which:

FIG. 12 is an explanatory diagram for explaining values of a constant table according to an embodiment 3 of the present invention;

FIG. 18 is an explanatory diagram for explaining a division/correction of a partial section;

FIG. 21 is an explanatory diagram for explaining the conventional constant table values;

DETAILED DESCRIPTION OF THE PREFERRED EMBODIMENTS

In this embodiment of the present invention, a description will now be made of such a technique capable of executing a correction of a partial section made in correspondence with a symbol of a subtraction type arithmetic code, while the simple arrangement of the prior art is substantially maintained, and also capable of improving compression performance.

Embodiment 1

In such a subtraction type arithmetic code as that of the above-explained prior art, an occupation rate of an LSZ section with respect to a valid section (effective section) becomes very high under such a condition that appearance prediction probability is approximated to 0.5, and a magnitude of the error thereof may cause the encoding performance to be lowered. In this embodiment 1 of the present invention, the SWTCH table 12 of the constant table of the prior art is not only employed so as to judge as to whether or not the prediction value is inversed, but also is used to obtain a partial section width except for consulting of the LSZ table 9. Since the SWTCH table 12 indicates that the prediction probability value of the state is equal to 0.5, at this time, the fixed value with respect to the state is not allocated from the LSZ table 9, but a half of the value of the A register 31 is allocated irrespective of such a fact that the value of the A register 31 is large, or small. Then, the error contained in the prediction probability, and the error contained in the occupation rate with respect to the valid section are reduced in order that the encoding performance can be improved.

Figure 1:
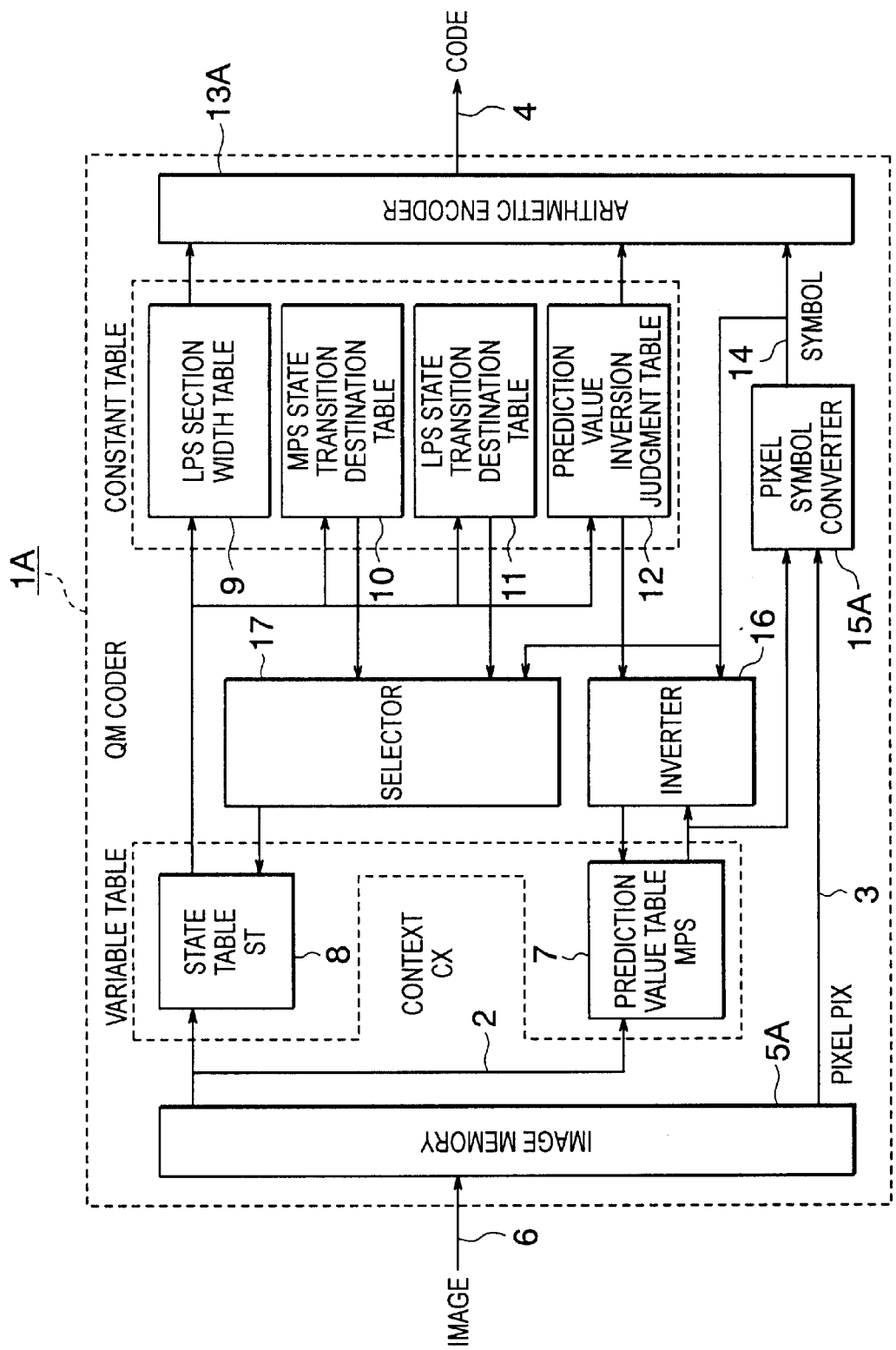
FIG. 1 is a schematic block diagram for indicating an arrangement of an encoder (encoding apparatus) according to the present invention.
Figure 2:
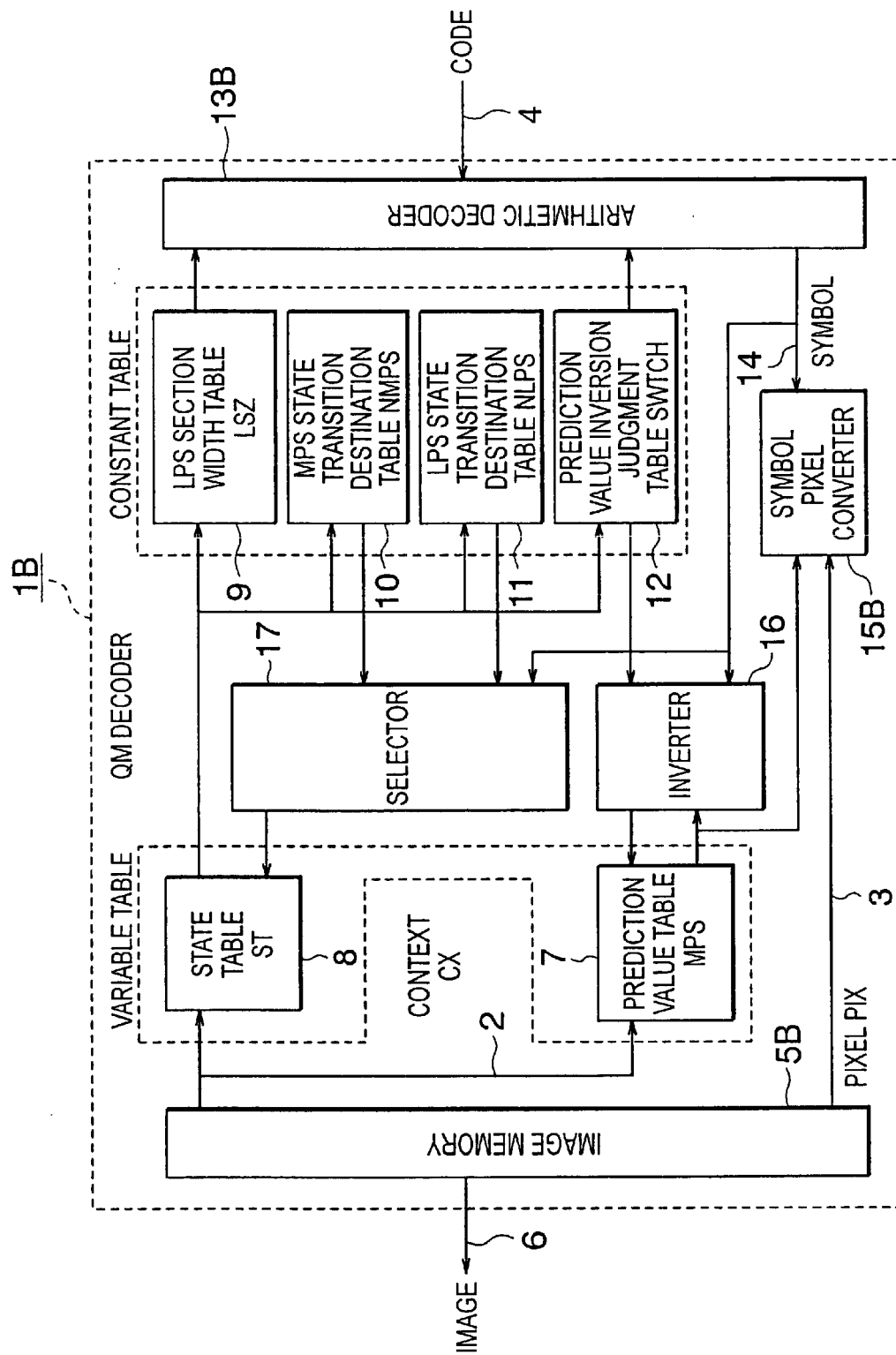
FIG. 2 is a schematic block diagram for showing an arrangement of a decoder (decoding apparatus) according to the present invention.
Figure 19:
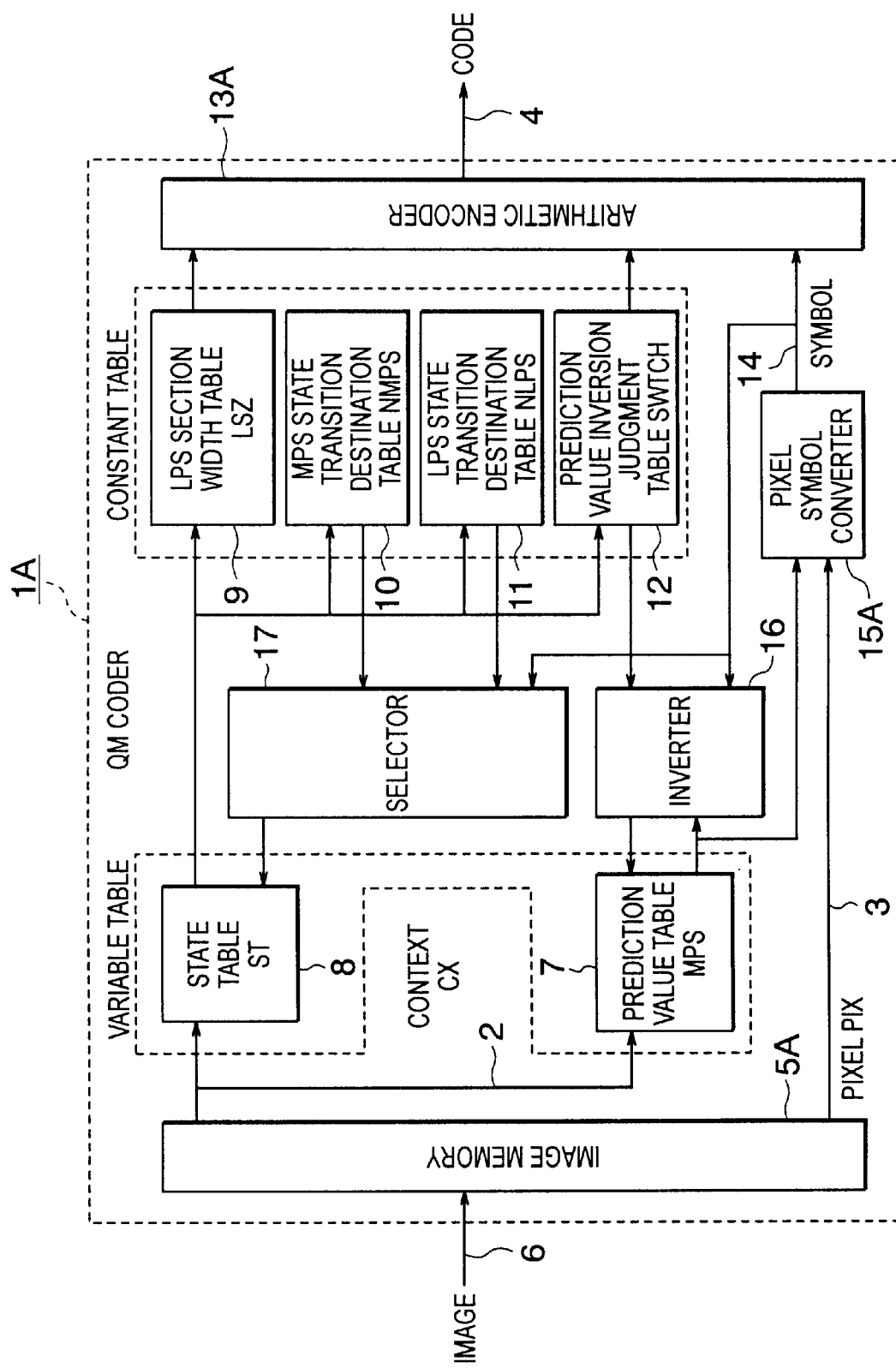
FIG. 19 is a block diagram for schematically indicating the arrangement of the conventional encoder.
Figure 20:
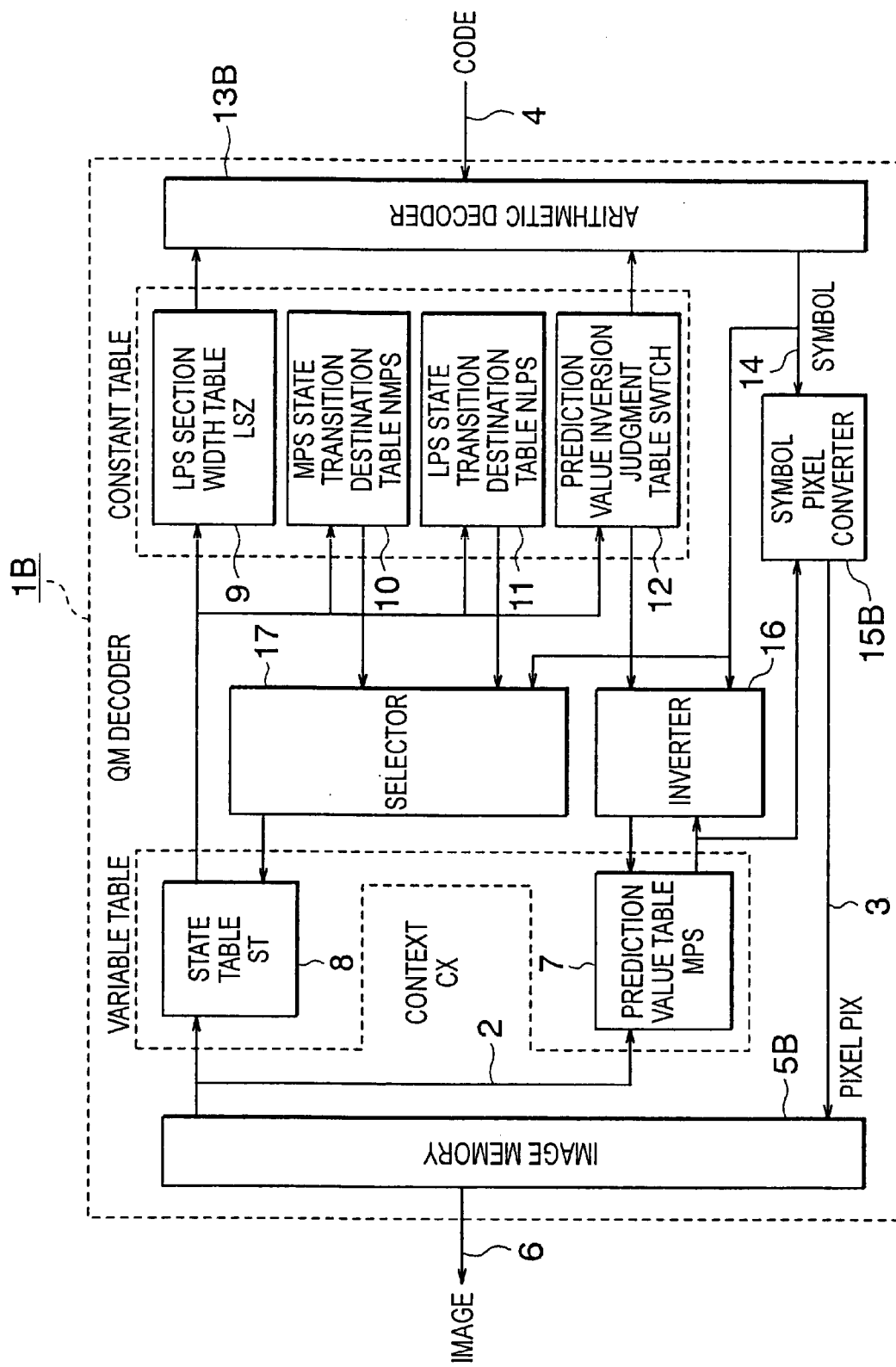
FIG. 20 is a block diagram for schematically showing the arrangement of the conventional decoder.
Figure 22:
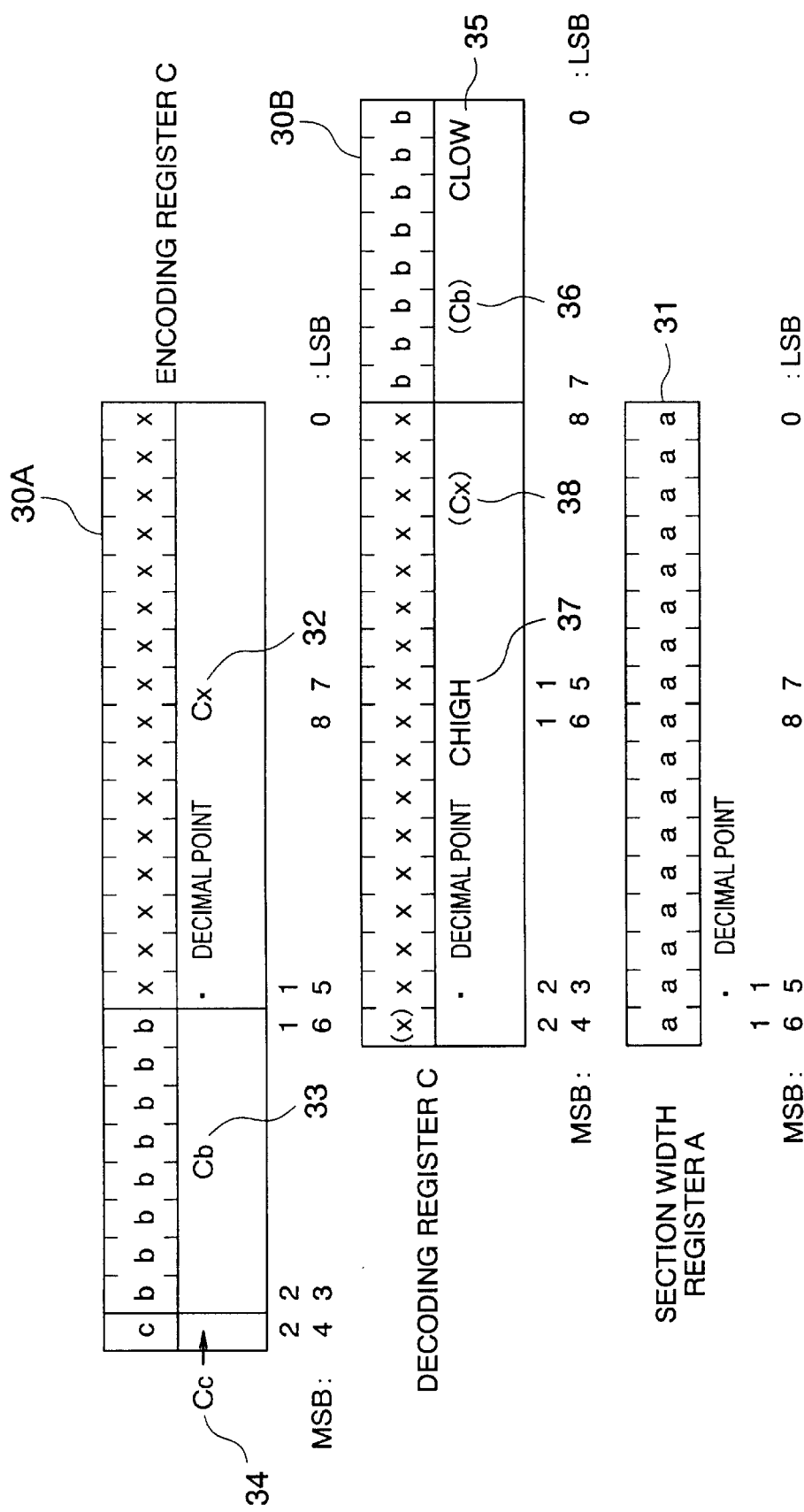
FIG. 22 is an explanatory diagram for explaining the conventional arrangement of the calculation register.

FIG. 1 and FIG. 2 show schematic structural diagrams of an encoder and a decoder according to this embodiment 1. With respect to the schematic structural diagrams of the known encoder/decoder shown in FIG. 19 and FIG. 20, there is such a different point that both the arithmetic encoder 13A and the arithmetic decoder 13B are arranged so as to refer to the value of the above-explained SWTCH table 12. Since other arrangements of these encoder/decoder are similar to those of the prior art, explanations thereof are omitted in the description.

Figure 23:
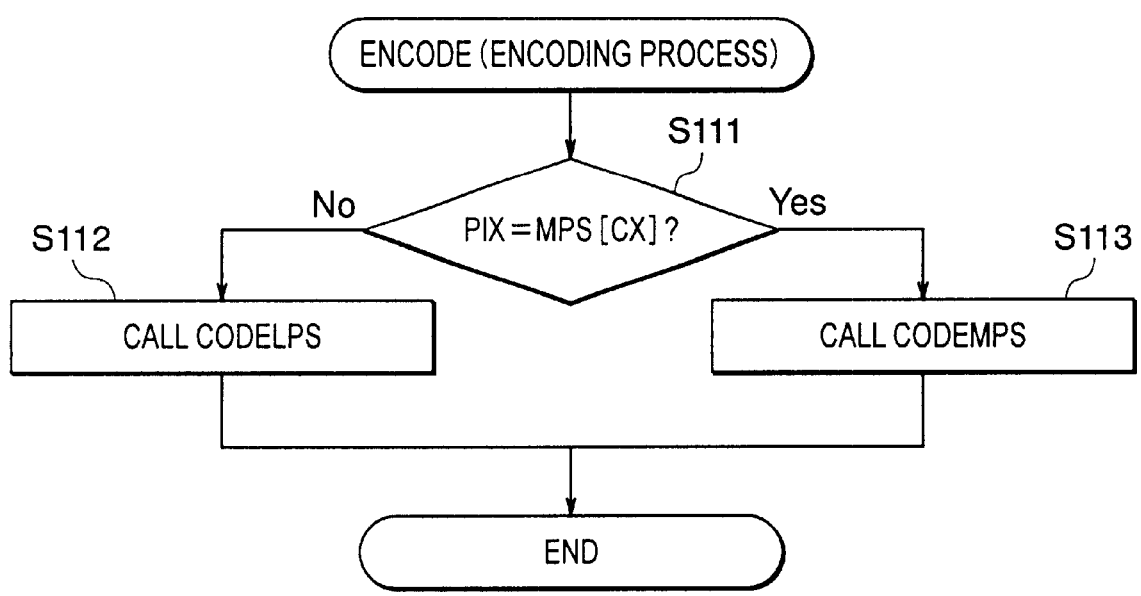
FIG. 23 is a flow chart for explaining the conventional ENCODE process flow operation.
Figure 29:
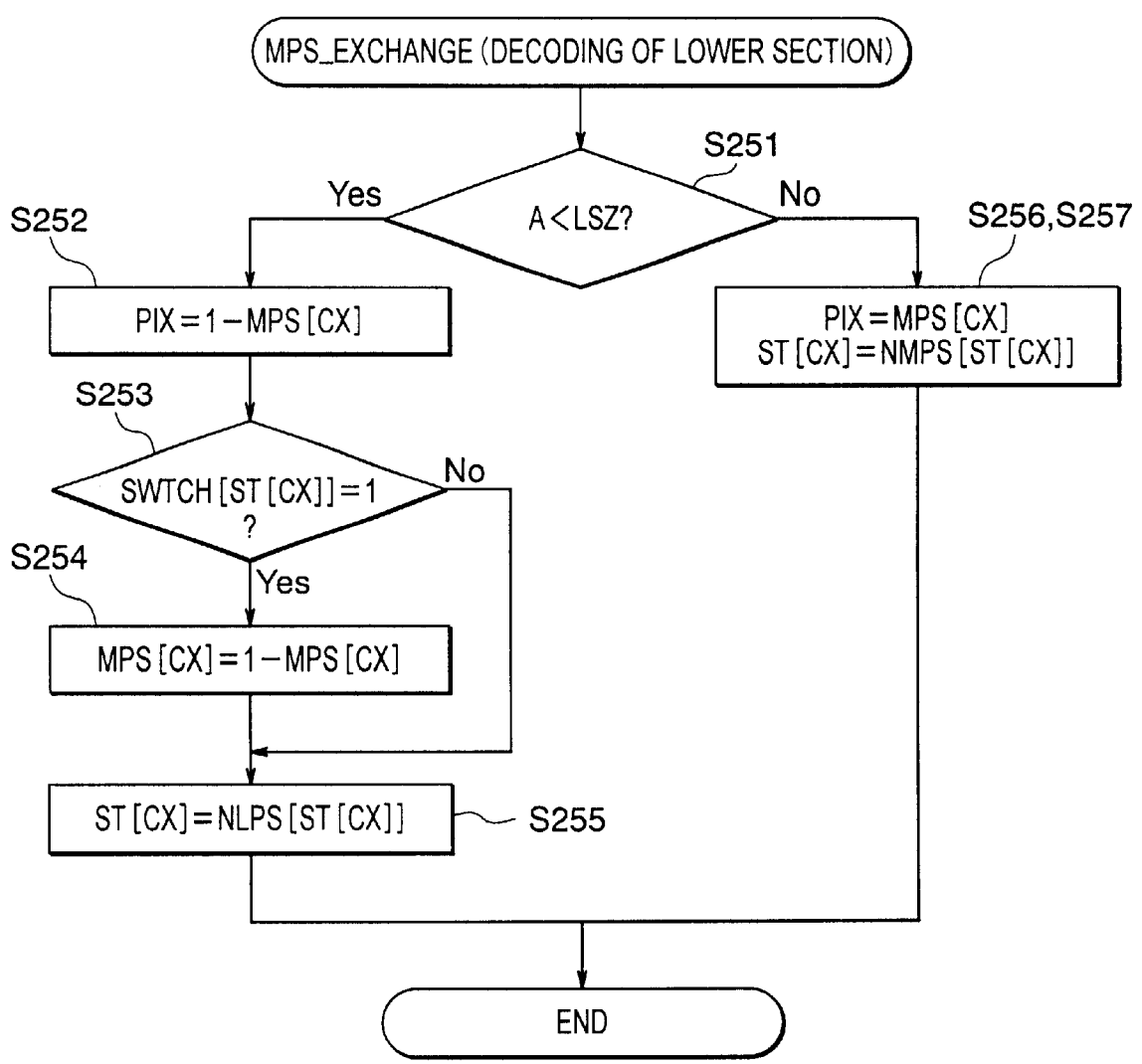
FIG. 29 is a flow chart for explaining the conventional MPS_EXCHANGE process flow operation.
Figure 30:
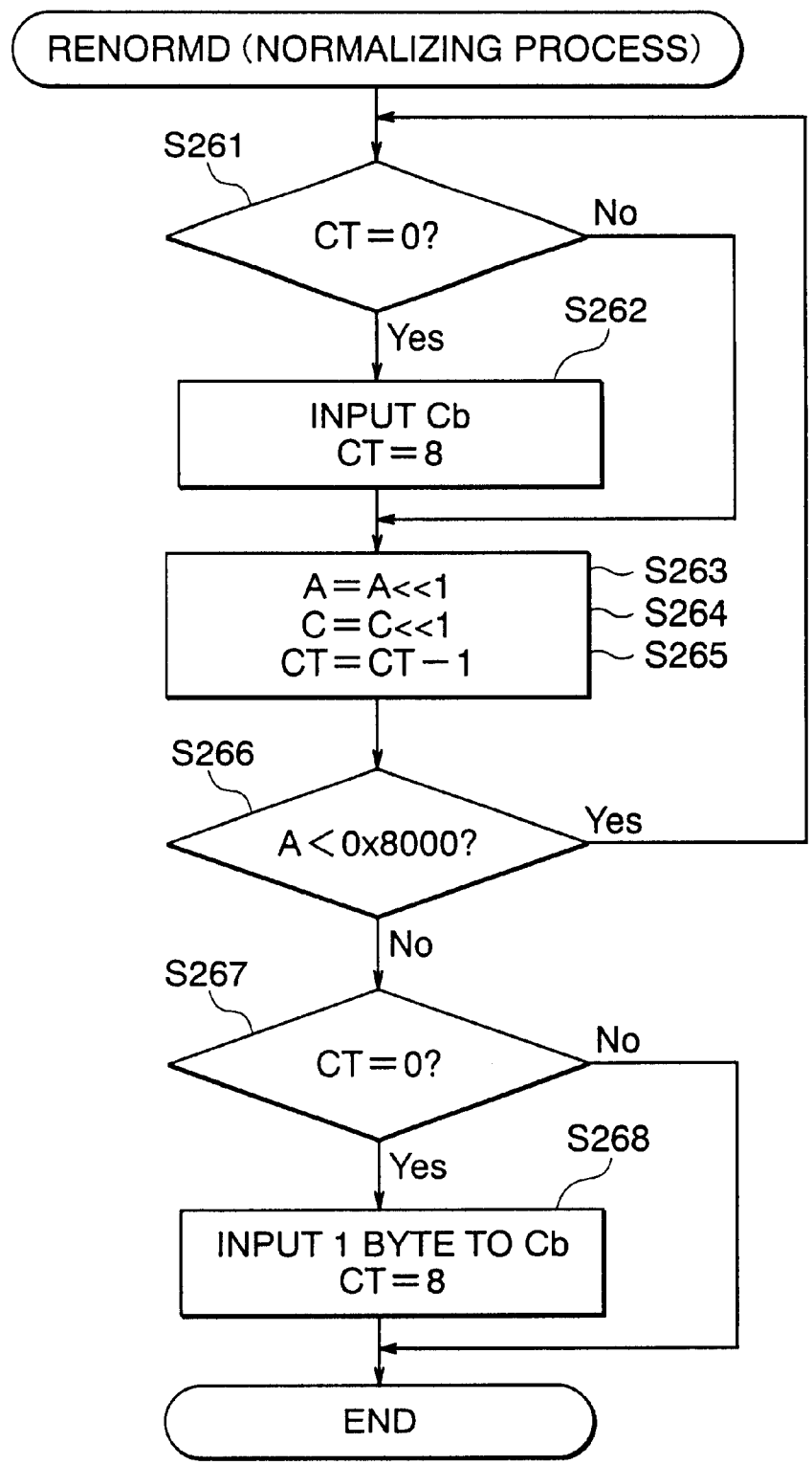
FIG. 30 is a flowchart for describing the conventional RENORMD process flow operation.

Both an encoding calculation process operation and a decoding calculation process operation will now be explained with reference to concrete process flows. In this embodiment 1, it is so assumed that the ENCODE process flow of FIG. 23, the RENORME process flow of FIG. 26, the LPS_EXCHANGE process flow of FIG. 28, the MPS_EXCHANGE process flow of FIG. 29, and also the RENORMD process flow of FIG. 30 are applied without any change, which are employed in the prior art.

Figure 3:
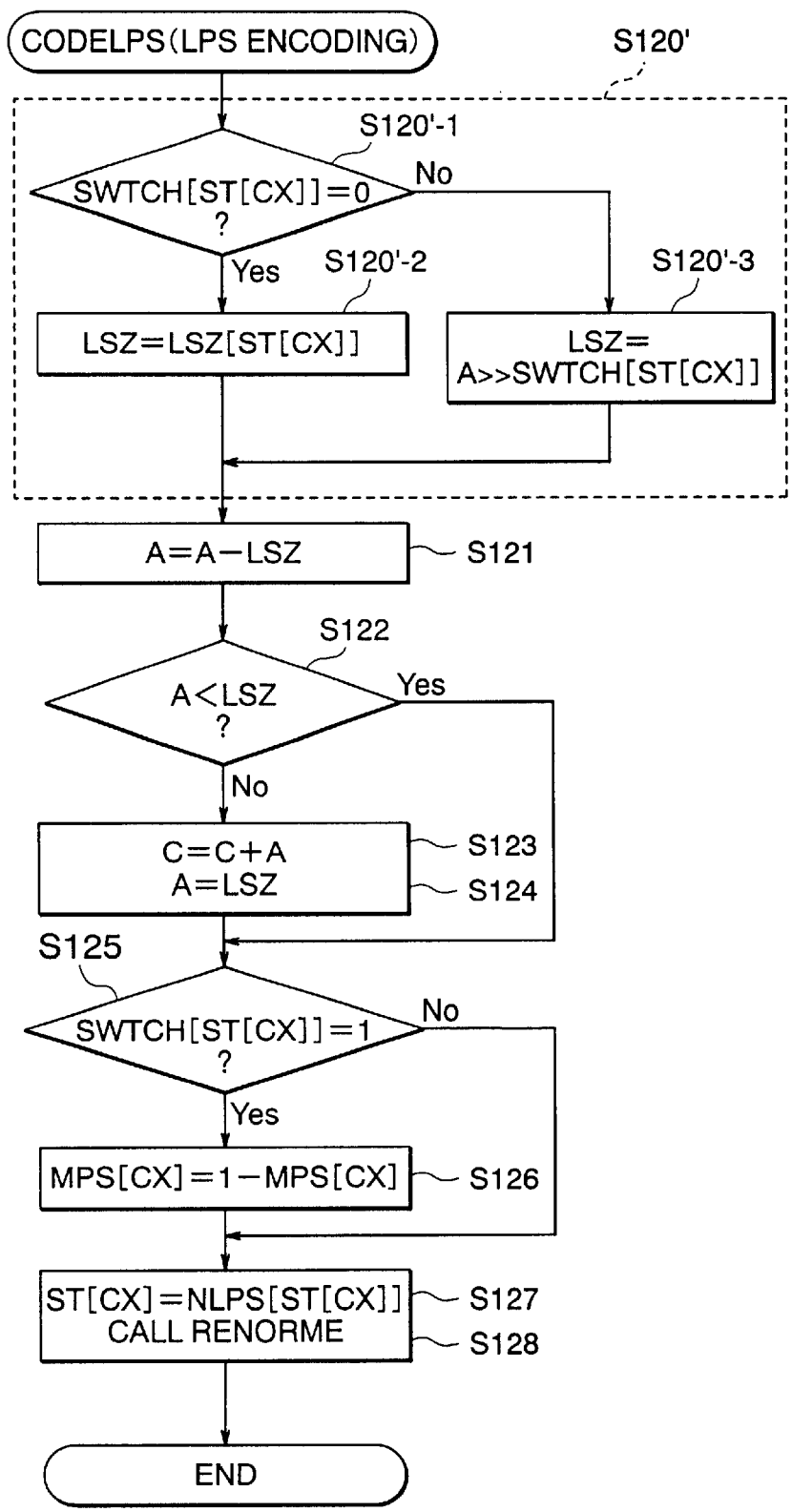
FIG. 3 is a flow chart for representing a CODELPS process flow operation according to an embodiment 1 of the present invention.
Figure 24:
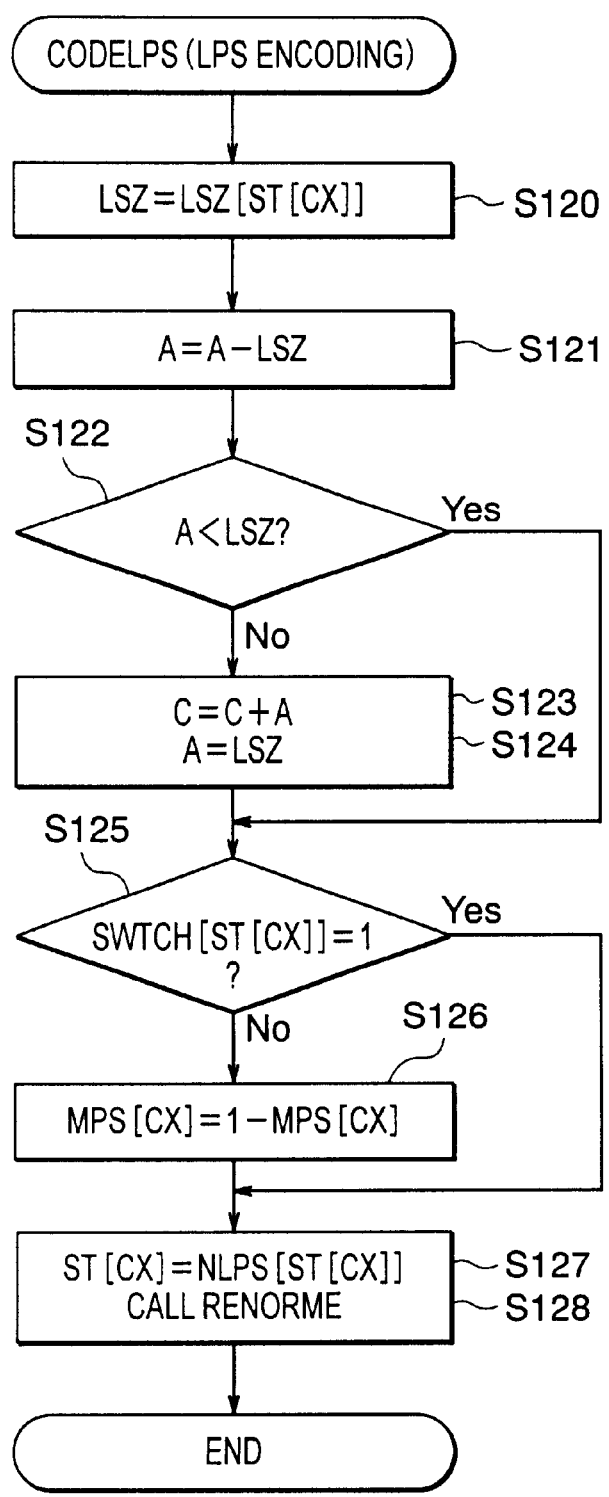
FIG. 24 is a flow chart for describing the conventional CODELPS process flow operation.

FIG. 3 is a flow chart for explaining a CODELPS process (LPS encoding) flow operation used to encode LPS, which is featured by that the step S120 of FIG. 24 is changed into a step S120'. At this step S120', when the value of the constant SWTCH 12 with respect to a present state ST[CX] is equal to "0" (step S120'-1), LSZ[ST[CX]] is applied in a similar manner to the prior art (step S120'-2). On the other hand, when the value of the constant SWTCH 12 is not equal to "0", a half of the value of the A register 31 is applied (step S120'-3). In this case, a calculation is made that the value of the A register 31 is shifted by the value (=1 digit) of the constant SWTCH 12 along the right direction. While the variable LSZ is set in such a manner as explained above, process operations subsequent to the step S121 are identical to the process flow operations of FIG. 24.

Figure 4:
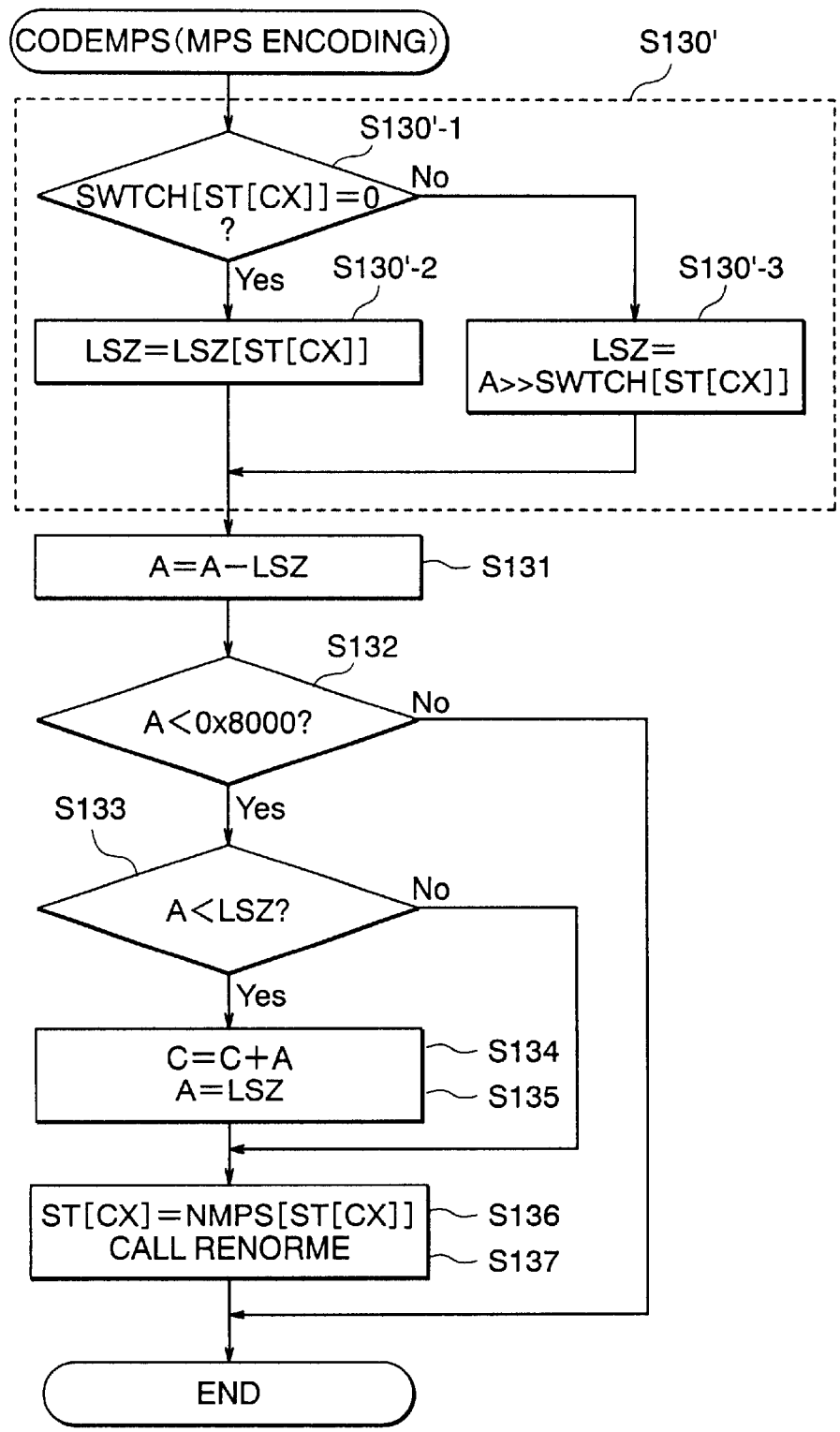
FIG. 4 is a flow chart for showing a CODEMPS process flow operation according to the embodiment 1 of the present invention.
Figure 25:
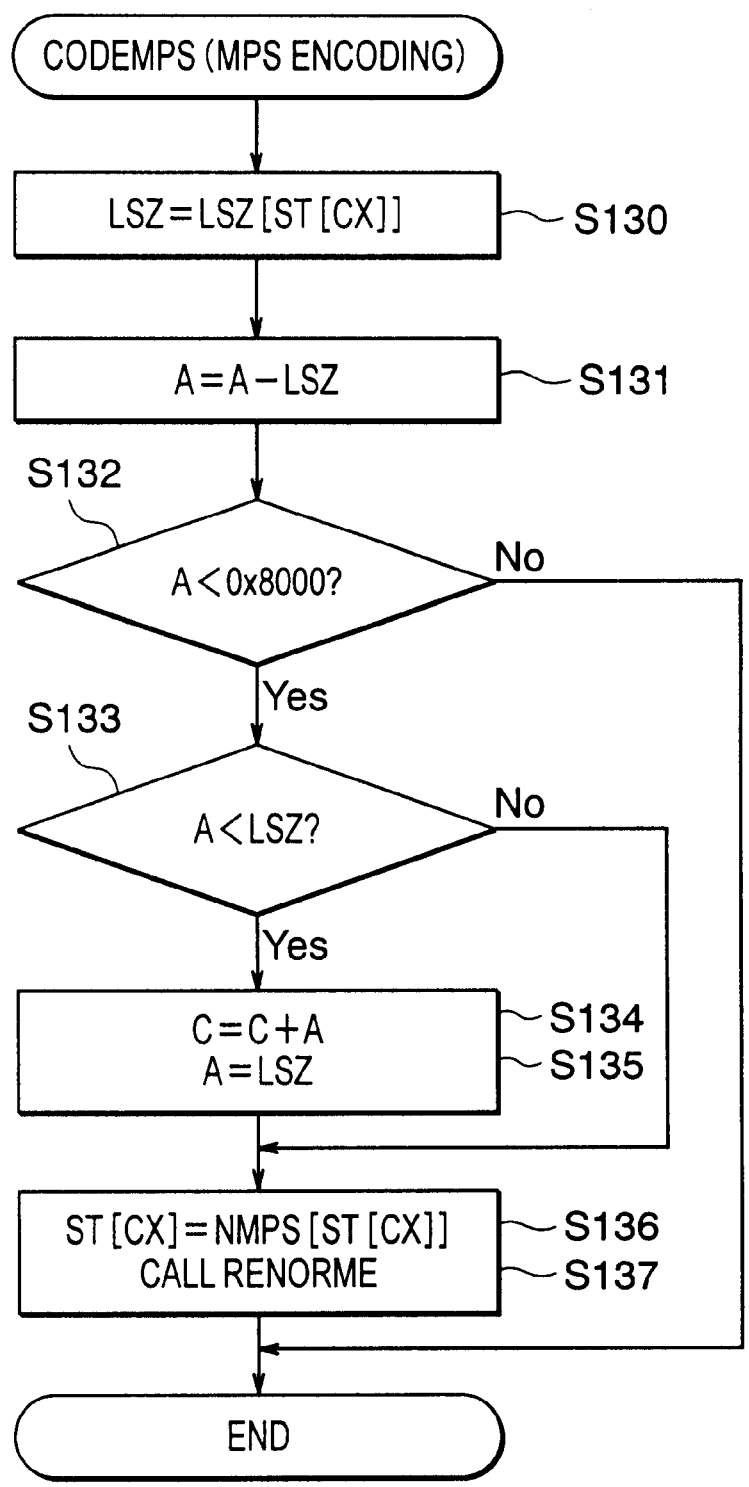
FIG. 25 is a flow chart for explaining the conventional CODEMPS process flow operation.

FIG. 4 is a flow chart for explaining a CODEMPS process (MPS encoding) flow operation used to encode MPS, which is featured by that the step S130 of FIG. 25 is changed into a step S130'. This step S130' is the same process as that of the step S120' of FIG. 3, and also process operations subsequent to the step S131 are identical to the process flow operation of FIG. 25.

Figure 5:
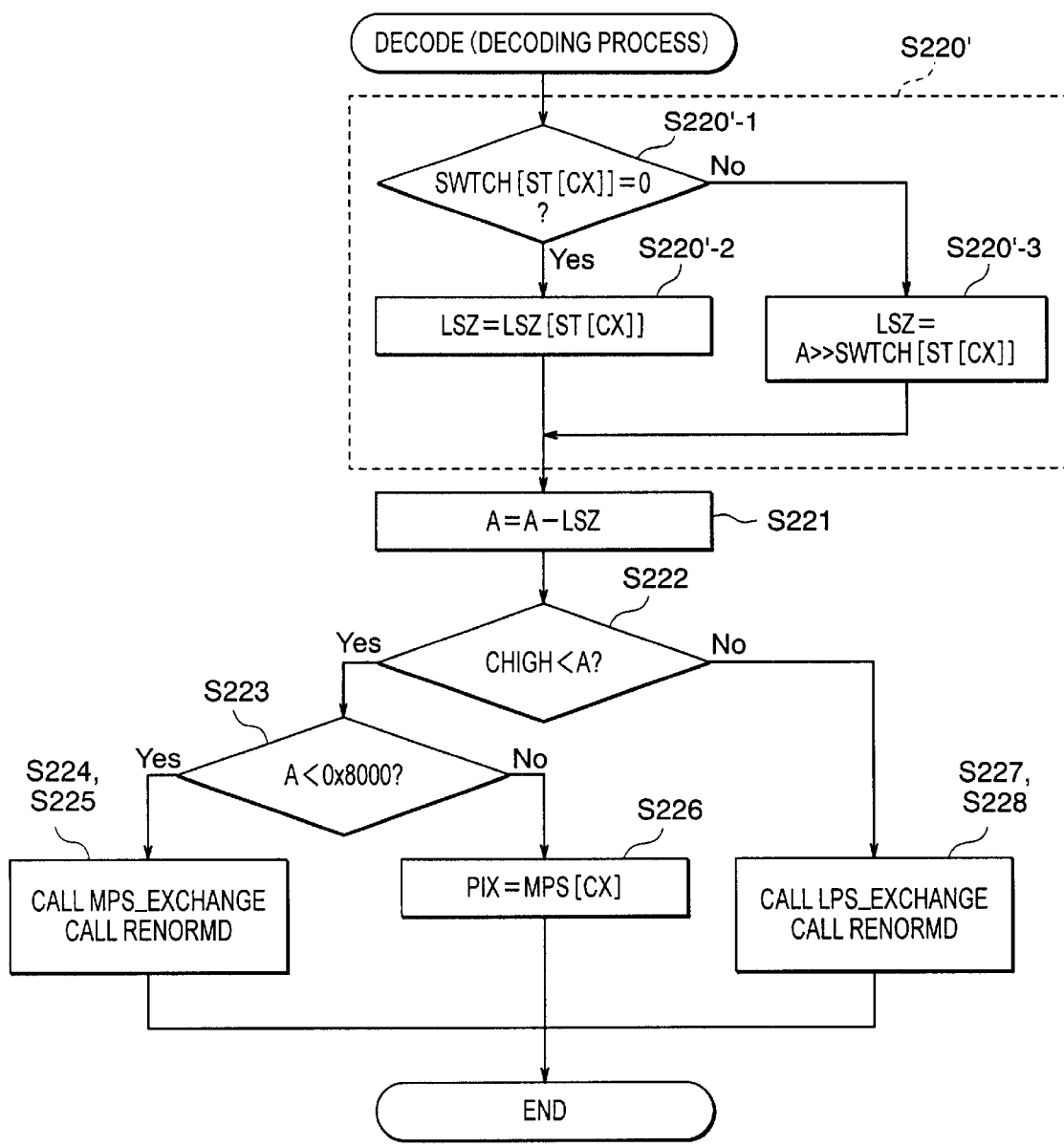
FIG. 5 is a flow chart for representing a DECODE process flow operation according to the embodiment 1 of the present invention.
Figure 27:
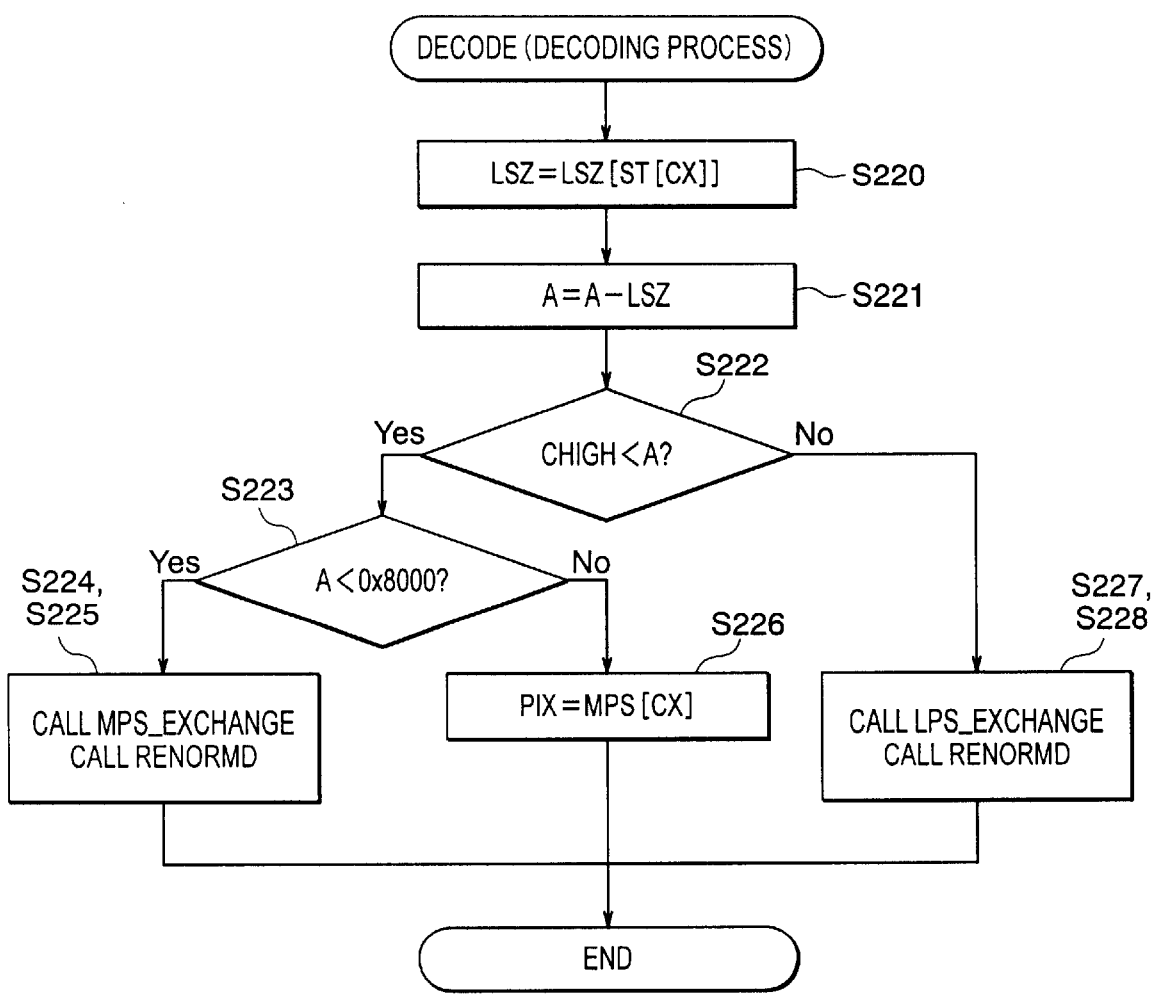
FIG. 27 is a flow chart for explaining the conventional DECODE process flow operation.

FIG. 5 is a flow chart for explaining a DECODE process (decoding process) flow operation used to decode a pixel which should be decoded, which is featured by that the step S220 of FIG. 27 is changed into a step S220'. This step S220' is the same process as that of the step S120' of FIG. 3, and also process operations subsequent to the step S221 are identical to the process flow operations of FIG. 27.

As previously described, both the encoder and the decoder, according to this embodiment 1, correspond to such an encoding apparatus and a decoding apparatus, which predict the appearance probability of the information source symbol while learning; divide the valid section on the numerical straight line into the first partial section and the remaining second partial section; and to which the such an arithmetic code is applied where the partial section corresponding to the appearing symbol is newly used as the above-explained valid section. The approximate value of the above-explained prediction appearance probability is applied. The encoding apparatus and the decoding apparatus are equipped with a storage means (SWTCH table 12), a judging means (step S120'-1), and a correcting means (step S120'-3). The storage means stores such a fact that the prediction appearance probability is the specific value (in this case "0"). The judging means judges as to whether or not the prediction appearance probability corresponds to this specific value with reference to the storage means. The correcting means corrects the allocation of the first and second partial sections when it is so judged that the prediction appearance probability corresponds to this specific value. Since the encoding apparatus and the decoding apparatus correct the allocation of the partial sections with respect to such a symbol which employs the specific value as the prediction appearance probability, there is such an effect that the encoding performance can be improved.

It should be noted that in this embodiment 1, when the value of the SWTCH 12 is equal to 1, the value of the A register 31 is shifted along the right direction by the digit corresponding to the value of the SWTCH 12 so as to calculate LSZ. Alternatively, LSZ may be directly described as an integer 1. Also, in the decoding process flow, at such a time instant when the value of CT50 becomes 0 at the step S267 and the step S268, the next code 4 is read into the CLOW register 35 by 1 byte. Alternatively, this code 4 may be read at the step S261 and the step S262 in the waiting condition until the code 4 is actually required by the next shift operation. Even when the decoding calculation process operation is advanced on the CHIGH register 37 under such a condition that the CLOW register 35 remains empty until this code 4 is read into this CLOW register 35, there is no problem.

Also, this first embodiment has a merit that the encoding performance can be improved for both the encoding operation and the decoding operation when the prediction appearance probability is approximately equal to 0.5. For instance, in a binary image data, in particular, even when learning is advanced in a pseudo half-tone image which is represented by either a dither manner or an error diffusion manner, it is well known that prediction probability remains near 0.5 without any deviation. As a result, this effect may be expected, as compared with the application to a character and an image.

This first embodiment has been described with regarding to both the encoding arithmetic process flow operation and the decoding arithmetic process flow operation of the above-explained preceding technical publication for executing the conditional MPS/LPS exchange by which MPS is allocated to the larger divided section. In both the arithmetic encoding operation and the arithmetic decoding operation by which the above-explained partial sections are not changed, since the occupation rate of the LSZ section with respect to the valid section may be inversed as to the large/small relationship with respect to the prediction probability, the large effect may be achieved by applying this manner. This effect may be similarly applied to other embodiment subsequent to this first embodiment.

Embodiment 2

Figure 26:
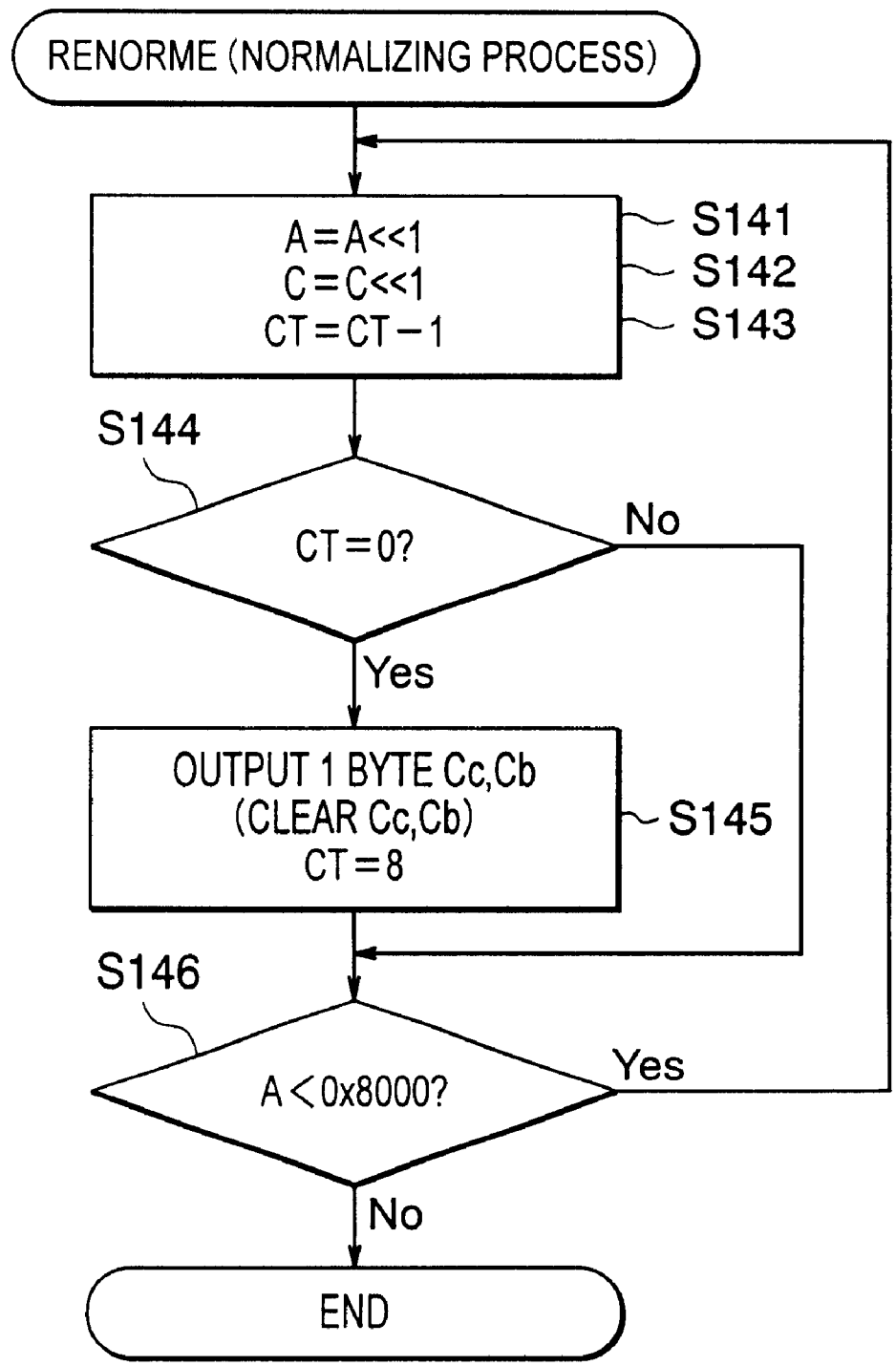
FIG. 26 is a flow chart for describing the conventional RENORME process flow operation.

The above-explained embodiment 1 owns the large redundancy in the process flows in view of such a point that the accomplishment of the renormalizing is formally judged in the RENORME process flow of FIG. 26 and the RENORMD process flow of FIG. 30. That is, when the LSZ value is determined, the value of the SWTCH 12 is consulated, and is furthermore and again consulted in the CODELPS process flow of FIG. 3, the LPS_EXCHANGE process flow of FIG. 28, and the MPS_EXCHANGE process flow of FIG. 29, which are applied in the conventional manner. Also, if the value of the A register 31 is selected to be ½, then this value is immediately multiplied by 2 by executing the renormalizing process operation, and it is apparent that the process operation is accomplished by way of the 1-bit shift. Also, if the value of the A register 31 is equal to the odd number, then such an error caused by the digit down may occur at a time instant when the value of this A register 31 is reduced by ½, so that this reduced value cannot strictly become ½. In other words, even in such a case that the value (namely, odd number) of the A register 31 is shifted by 1 digit and compressed to obtain as a partial section, and thereafter, this partial section is shifted by 1 digit by executing the process operation and enlarged, the resultant value is not returned to the original value of the A register 31. However, such a point that LSZ which should be recognized as the LPS section width becomes smaller than A-LSZ may be theoretically applied to the symbol definition. In accordance with this second embodiment, the above-described redundancy may be improved by separating the process path based upon the SWTCH value, and such a process flow is provided. This process flow can solve the above-explained digit drop error by changing the renormalizing sequential operations. In other words, in this second embodiment, while one of specific values stored in a storage means is selected to be ½, a series of calculation process operation executed by updating a predictable target symbol value of the above-explained prediction appearances probability with respect to the relevant symbol is independently arranged from a calculation process operation as to an irrespective symbol.

It should also be noted that in the process flow operations explained in this embodiment, newly added process operations are surrounded by broken-line-frames, and process numbers indicated in these broken-line frames are indicated by adding dashes to the corresponding process numbers of the prior art process flow operations. In this second embodiment, it is so assumed that the ENCODE process flow of FIG. 23, the RENORME process flow of FIG. 26, and the RENORMD process flow of FIG. 30, which are employed in the prior art, are supplied without any change.

Figure 6:
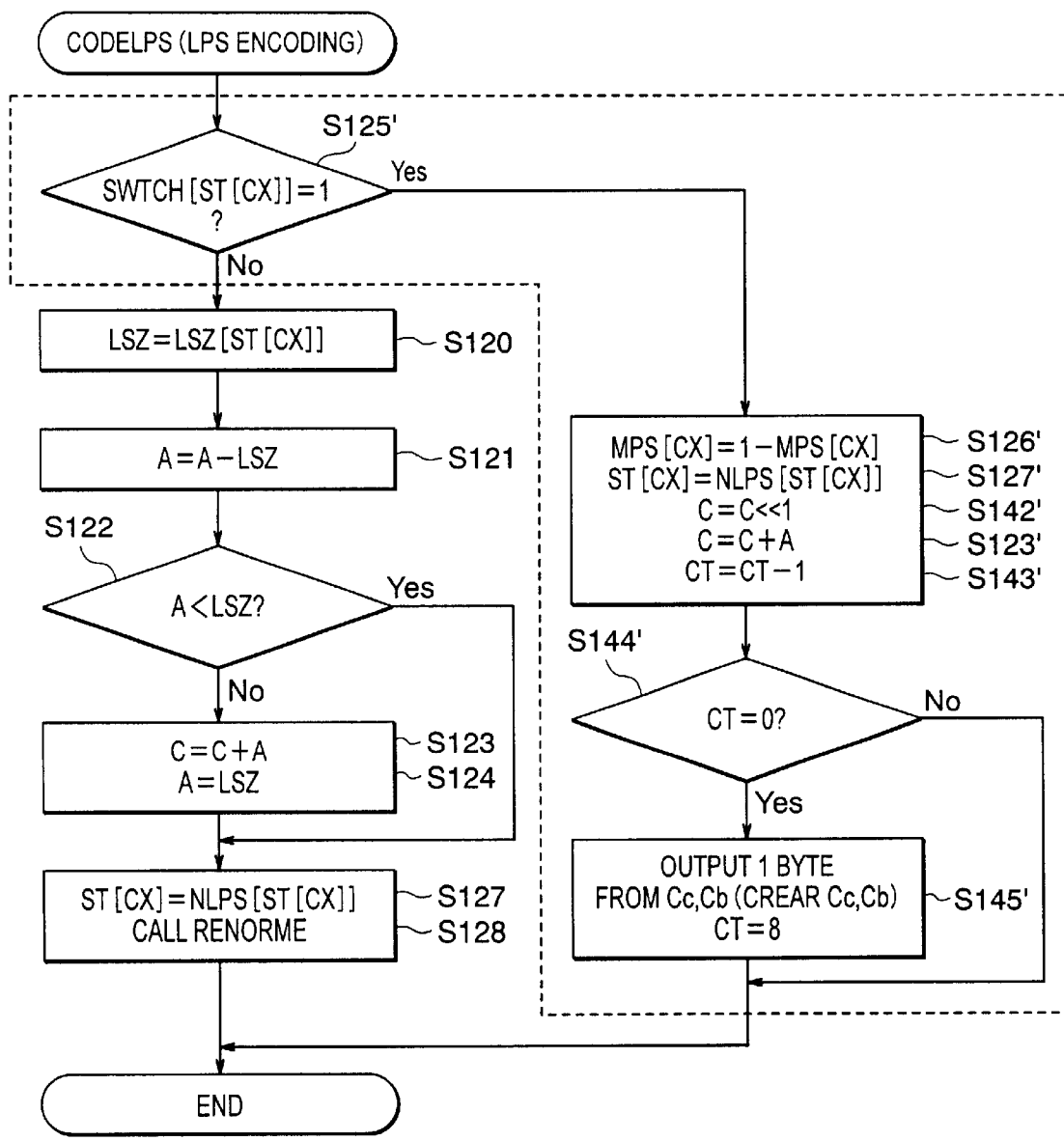
FIG. 6 is a flow chart for showing a CODELPS process flow operation according to an embodiment 2 of the present invention.

FIG. 6 represents a CODELPS process (LPS encoding) flow operation for encoding LPS, according to this second embodiment, which is featured by that the step S125 and the step S126 are extracted from the steps of FIG. 24, and a process operation surrounded by a broken line is newly added in front of the step S120. When the value of the SWTCH 12 is equal to 1 at a judgment step of S125', the process operation is switched to the process path surrounded by the broken-line-frame. At a step S126', the prediction value 7 (MPS table) is inversed/updated. At a step S127', a state transition is carried out by referring to the NLPS table 11. A step S142' corresponds to a shift process operation of a renormalizing process operation. Thereafter, a digit drop may be avoided at a step S123' by way of a sequential operation in which the value of the A register 31 is added to the value of the C register 30A. At a step S143' of the renormalizing process operation, 1 is subtracted from the variable CT50. At a step S144', a check is made as to whether or not the variable CT50 is equal to "0." When the judgment result is "YES", a 1-byte code 4 is outputted from the C register 30A (Cb) at a step S145', and "8" is again set to the variable CT50. When the value of the SWTCH 12 is not equal to 1, process flow operations defined from the step S120 up to the step S128 except for the steps S125 and S126 are identical to the process flow operations shown in FIG. 24.

Figure 7:
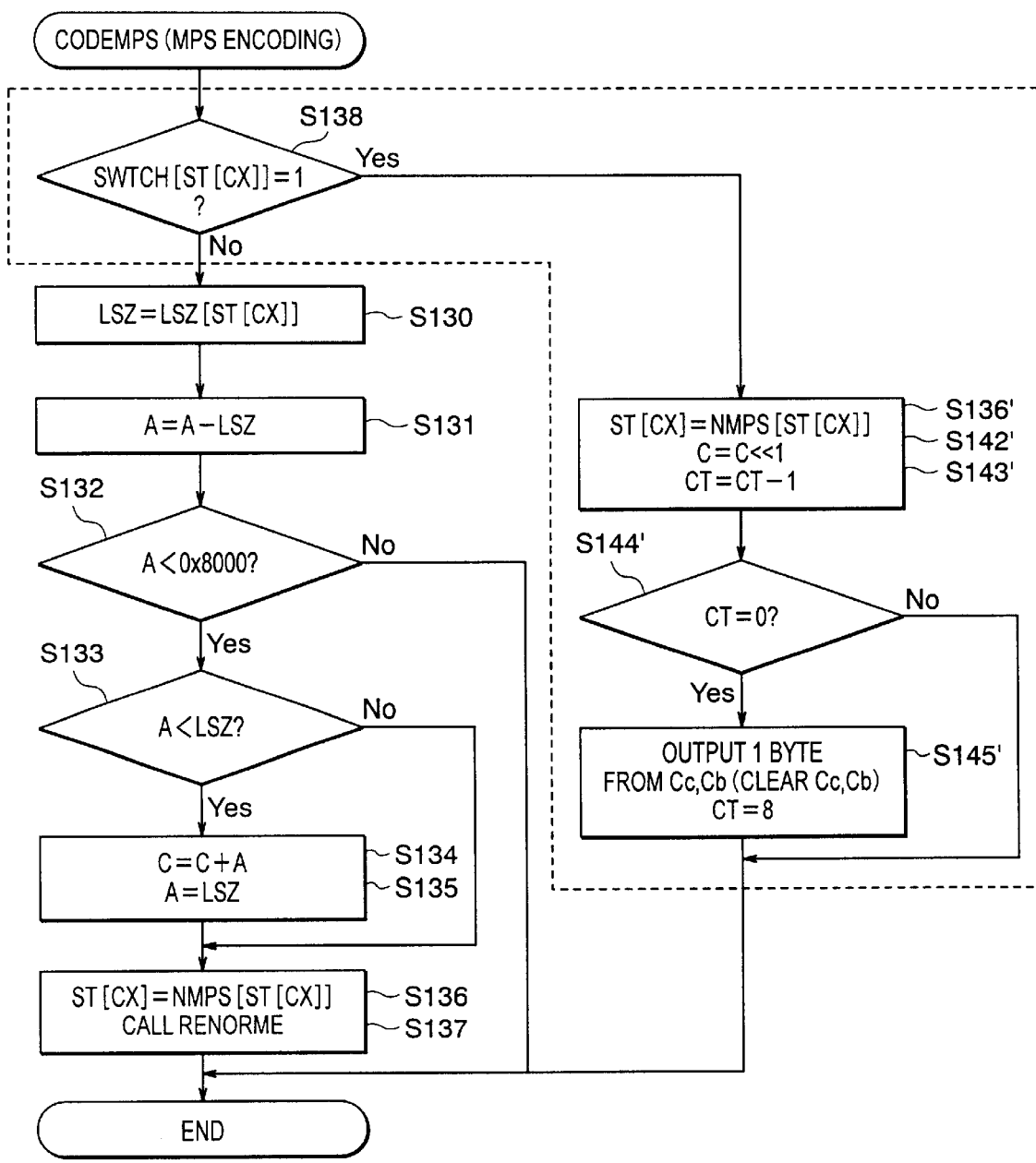
FIG. 7 is a flow chart for indicating a CODEMPS process flow operation according to the embodiment 2 of the present invention.

FIG. 7 represents a CODEMPS process (MPS encoding) flow operation for encoding MPS, according to this second embodiment, which is featured by that a process operation surrounded by a broken line is newly added in front of the step S130 of FIG. 25. When the value of the SWTCH 12 is equal to 1 at a judgment step of S138, the process operation is switched to the process path surrounded by the broken-line-frame. At a step S136', a state transition is carried out by referring to the NMPS table 10. A step S142' corresponds to a shift process operation of a renormalizing process operation. At a step S143' of the renormalizing process operation, 1 is subtracted from the variable CT50. At a step S144', a check is made as to whether or not the variable CT50 is equal to "0." When the judgment result is "YES", a 1-byte code 4 is outputted from the C register 30A (Cb) at a step S145', and "8" is again set to the variable CT50. When the value of the SWTCH 12 is not equal to 1, process flow operations defined from the step S130 up to the step S137 are identical to the process flow operations shown in FIG. 25.

Figure 8:
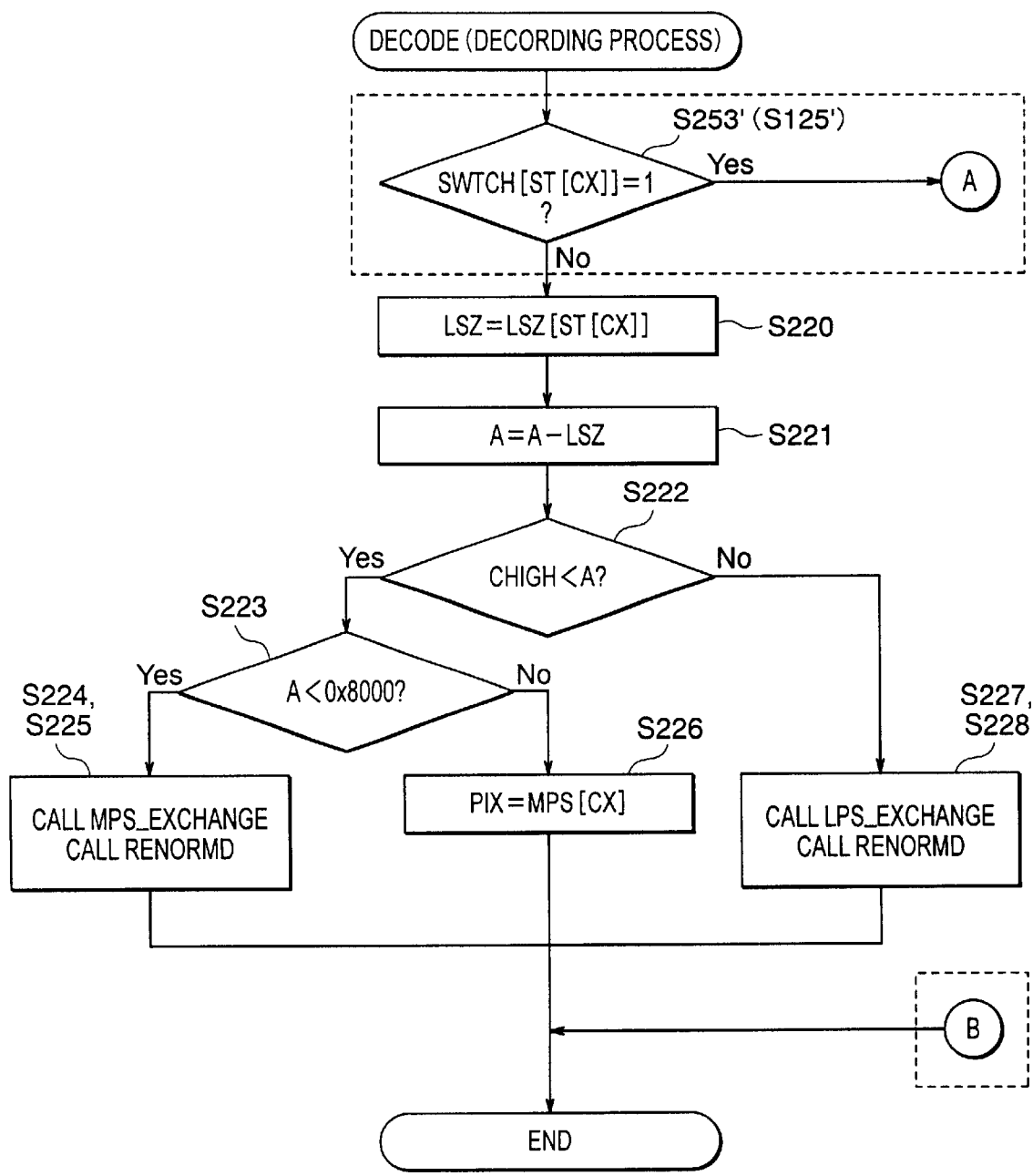
FIG. 8 is a flow chart for representing a DECODE process flow operation according to the embodiment 2 of the present invention.

FIG. 8 indicates a DECODE process flow operation used to decode a pixel which should be decoded, which is featured by a process operation surrounded by a broken line and is newly added in front of the step S220 of FIG. 27. When it is so judged at a step S239' (also corresponding to step S253') that the value of the SWTCH 12 is equal to 1, the process path surrounded by the broken-line-frame is switched, a process flow operation of FIG. 9 (will be discussed below) is executed from a point "A", and then is returned to a point "B." To the contrary, when the value of the SWTCH 12 is not equal to 1, process operations defined from the step S220 to the step S228 are identical to the process flow operations of FIG. 27.

Figure 9:
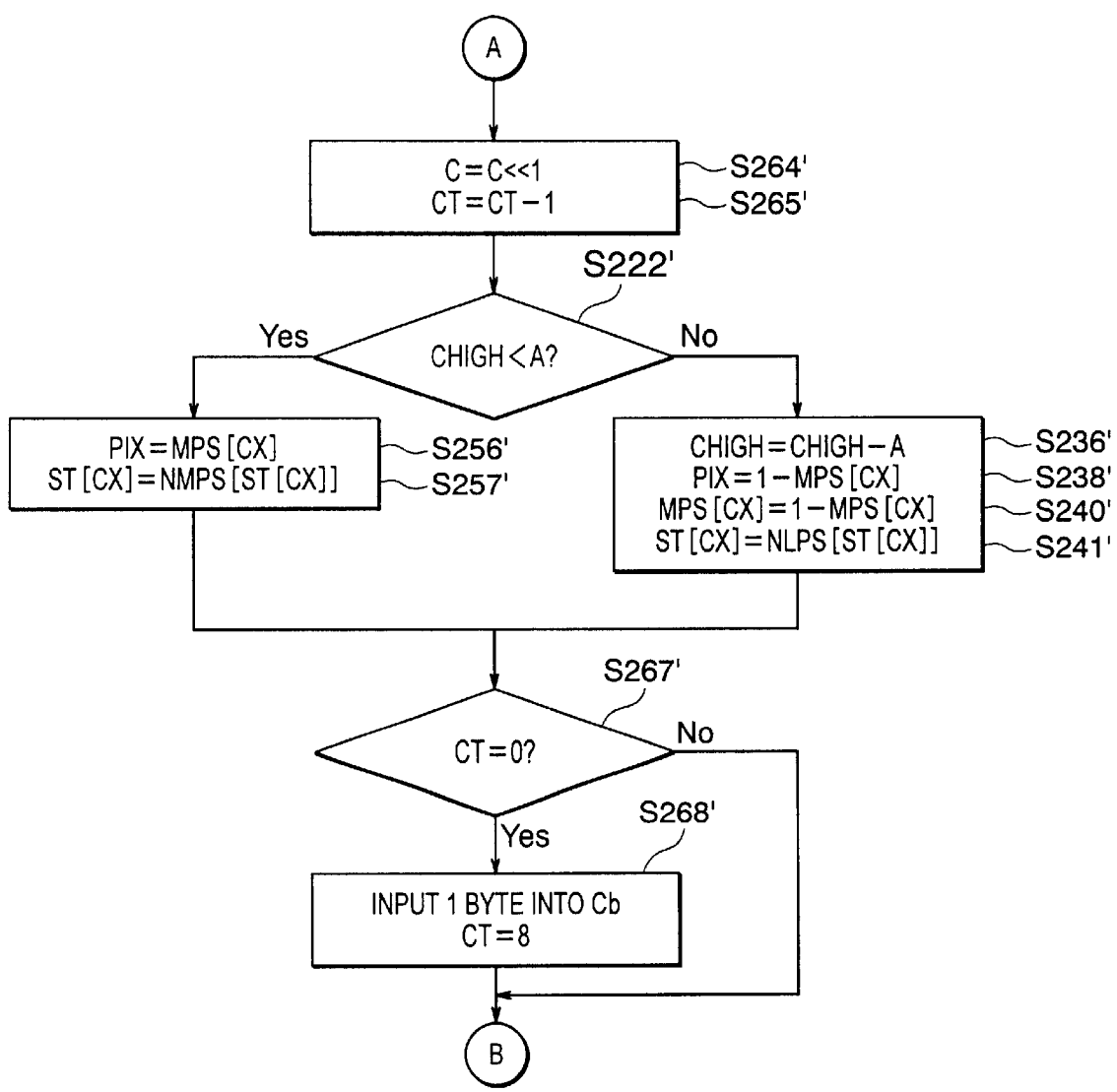
FIG. 9 is a flow chart for showing a DECODE process flow operation continued to the flow chart of FIG. 8 according to the embodiment 2 of the present invention.
Figure 28:
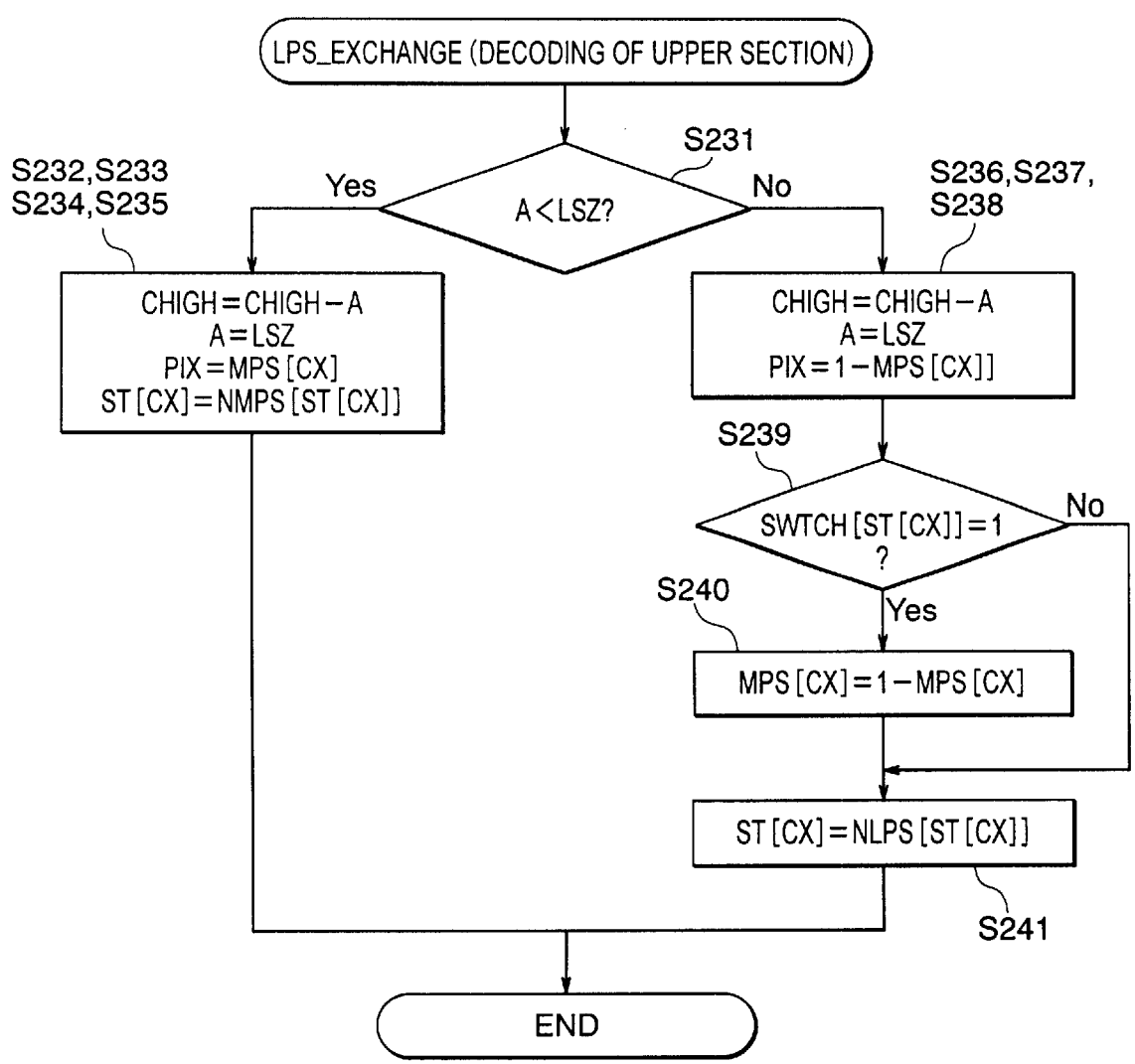
FIG. 28 is a flow chart for describing the conventional LPS_EXCHANGE process flow operation.

FIG. 9 indicates a DECODE process flow operation with respect to such flow portions which could not be represented in FIG. 8, namely from (A) of FIG. 8 up to (B) of FIG. 8. A step S264' corresponds to a shift process operation of a renormalizing process operation. At a step S265', 1 is subtracted from the variable CT50. When it is so judged at a step S222' that the value of the code CHIGH register 37 is smaller than the value of the A register 31 (namely, the answer is "YES"), a lower section is decoded. In this process flow operation, since a width of a lower section is equal to a width of an upper section, the lower section corresponds to MPS. As a result, at a step S256', the pixel value 3 is used as the prediction value 7. At a step S257', a state transition is performed by referring to the NMPS table 10. When it is so judged at the step S222' that the value of the code CHIGH register 37 is larger than, or equal to the value of the A register 31 (namely, the answer is "NO"), an upper section corresponding to LPS is decoded. At a step S236', the width of the lower section is subtracted from the CHIGH register 37, and at a step S238', the pixel value 3 is set as a non-prediction value (1-prediction value 7). Since the value of the SWTCH 12 is necessarily equal to 1 in this process flow operation, the judgment step S239 of FIG. 28 is not required, and then, the prediction value 7 (MPS table) is inversed/updated at a step S240'. At a step S241', a state transition is carried out by referring to the NLPS table 11. After the state transition is carried out, a judgment is made at a step S267' as to whether or not the variable CT50 is equal to 0. When the judgment result is "YES", a 1-byte code 4 is inputted to the C register 30B (Cb) at a step S268', and also, 8 is again set to the variable CT50.

Figure 10:
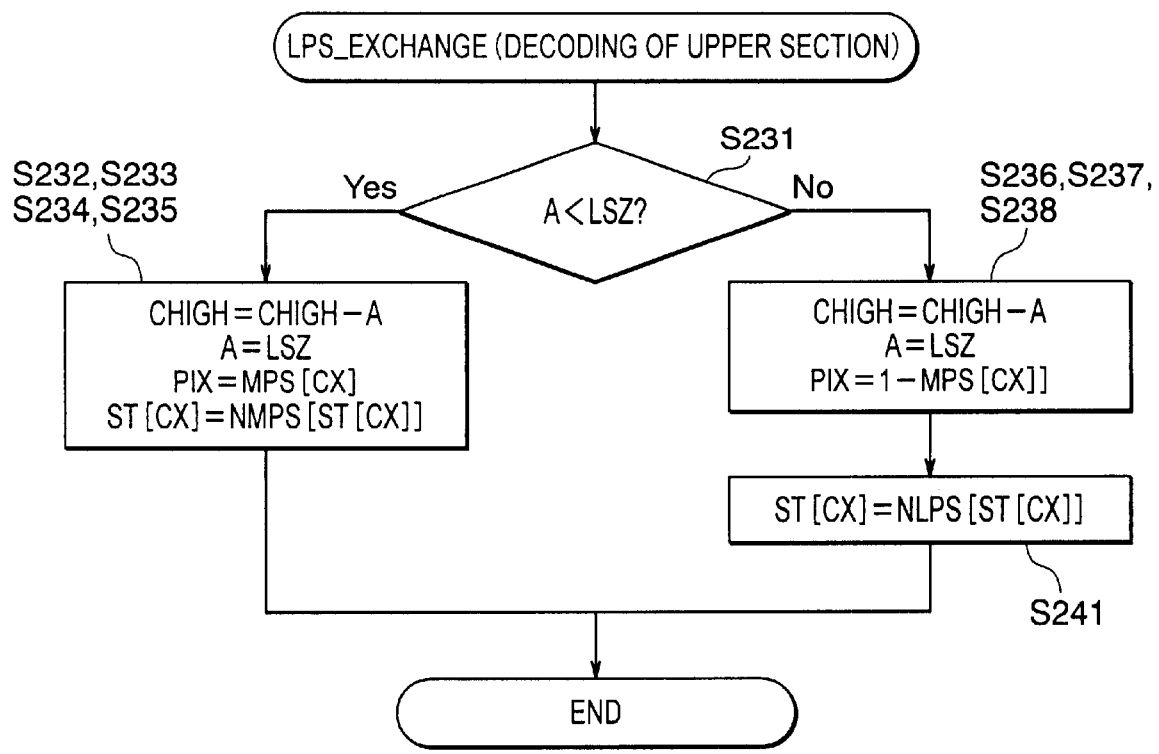
FIG. 10 is a flow chart for representing an LPS_EXCHANGE process flow operation according to the embodiment 2 of the present invention.

FIG. 10 is a flow chart for describing an LPS_EXCHANGE process operation (decoding of upper section) used to decode an upper section. Since this process flow operation is not such a process path in which the value of SWTCH 12 is equal to 1 judged by the step S239' of FIG. 8, both the step S239 and the step S240 are not required. As a result, these steps are deleted, and other process operations of this process flow operation are identical to the process flow operation of FIG. 28.

Figure 11:
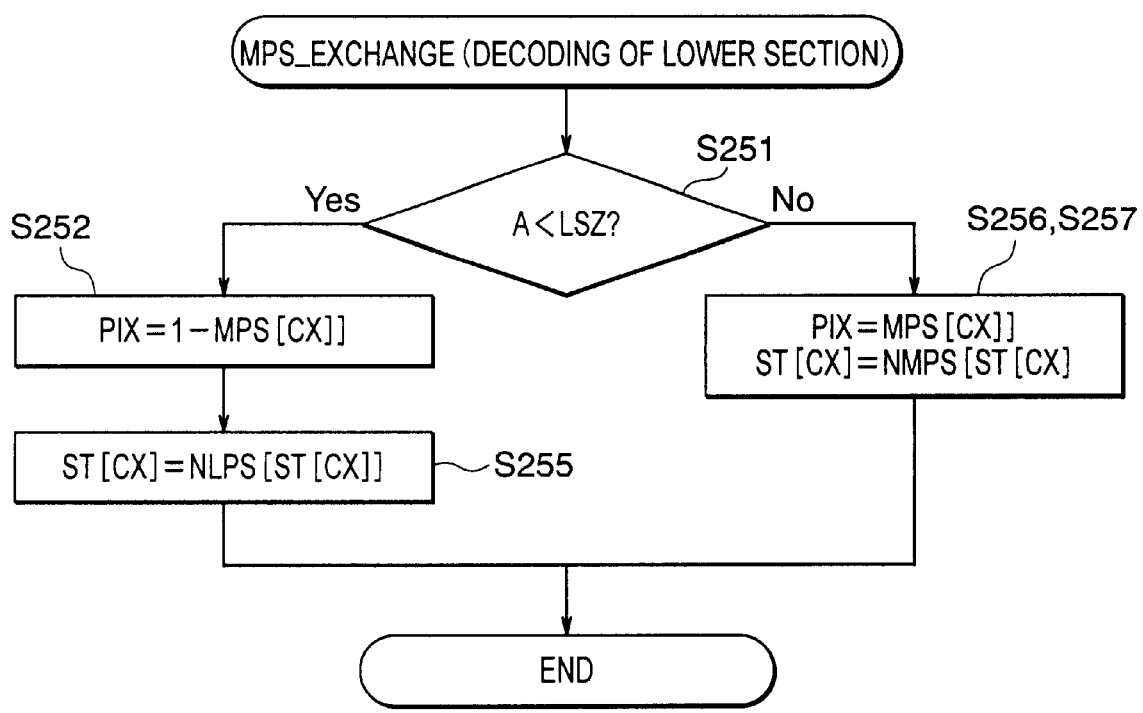
FIG. 11 is a flow chart for showing an MPS_EXCHANGE process flow operation according to the embodiment 2 of the present invention.

FIG. 11 is a flow chart for describing an MPS_EXCHANGE process operation (decoding of lower section) used to decode a lower section. Since this process flow operation is not such a process path in which the value of SWTCh 12 is equal to 1 judged by the step S239' of FIG. 8, both the step S253 and the step S254 are not required. As a result, these steps are deleted, and other process operations of this process flow operation are identical to the process flow operation of FIG. 29.

In contract to the prior art in which after the valid section has been calculated, and also the partial section is enlarged by executing the renormalizing process operation, in accordance with this second embodiment, while both the calculation process and the renormalizing process are not separated from each other in the process flow operation, the partial section is enlarged and thereafter, the enlarged partial section is calculated, which are described as the procedure. As a consequence, when the value of the SWTCH 12 is equal to 1, it is possible to avoid the digit drop error which is caused by the restrictions in the expression precision in the case that the partial sections of MPS and LPS of the A register 31 are equally subdivided. It should also be noted that since the shift process of the renormalizing process operation is firstly executed and then the CHIGH register 37 is calculated, one digit (bit 24) of an integer part is required in the C register 30B of FIG. 24.

Also, while the encoding operation and the decoding operation are carried out, both initial values of the A registers 30A and 30B are selected to be 0x10000 similar to those of the prior art. However, in the prior art, there is no possibility that the value of the A register becomes this initial value after the second symbol. In this second embodiment, while symbols subsequent to the first symbol are processed, the A registers 30A and 30B continuously own the above-explained initial value as long as the value of SWTCH 12 becomes 1. Since both the encoding process operation and the decoding process operation correspond to such process operations having repeatability, the decoding possibility can be guaranteed. It should also be noted that when the encoding operation and the decoding operation are carried out, if both the initial values of the A registers 30A and 30B are changed together, then there is no possibility that the initial values including the first symbol become 0x 10000. At this time, since the changed value is set to 0xFFFF, lowering of the encoding performance (loss of encoding length) which is caused by changing the initial value can be suppressed to a minimum loss. Since both the two partial regions divided by the first symbol become 0x7FFF.8 (one decimal digit of hexadecimal number system)" and thus become smaller than 0x 8000, the renormalizing process operation is required. However, the enlargement of the partial region corresponding to the renormalizing process operation is performed at first in accordance with the above-explained process flow operation, the value of the valid section is processed while keeping 0xFFFF.

As previously explained, in accordance with this embodiment 2, a similar effect to that of the above-explained embodiment 1 can be achieved. Furthermore, while one of specific values stored in the table is selected to be ½, a series of calculation process operation executed by updating the predictable symbol value of the above-explained appearance probability with respect to the relevant symbol is independently arranged from the calculation process operation as to the irrespective symbol. Therefore, calculation process without redundancy can be carried out.

Also, in this second embodiment, since both the following renormalizing process operation and the code output process operation are carried out in the encoding operation applied to the relevant symbol, the code calculation is carried out after the enlarging process operation equivalent to the renormalizing process operation, so that the representation precision of the valid section can be maintained in the maximum precision. In the renormalizing process operation, the above-explained correcting device corrects both the first partial section and the second partial section, assuming that both the above-mentioned first/second partial sections are equal to the valid section. The correcting device executes the shift process by only 1 digit of the code, or the multiplication by 2 so as to enlarge the first/second partial sections without changing the valid section. Thereafter, the correcting device can maintain the representation precision of the valid section in the maximum precision by calculating the code value. Also, the correcting device outputs such a code which may be outputted after the code has been updated by the renormalizing means.

In this second embodiment, since both the following renormalizing process operation and the enlarging process operation are carried out in the decoding operation applied to the relevant symbol, the representation precision of the valid section can be kept in the maximum precision. In the renormalizing process operation, the above-explained correcting device corrects both the first partial section and the second partial section, assuming that both the above-mentioned first/second partial sections are equal to the valid section. The correcting device executes the shift process by only 1 digit of the code, or the multiplication by 2 so as to enlarge the first/second partial sections without changing the valid section. Thereafter, the correcting device can maintain the representation precision of the valid section in the maximum precision by calculating the code value. Also, the correcting device executes the code calculation after the enlarging process operation equivalent to the renormalizing process operation, while this correcting device is equipped with the code input means which previously prepares the code input and inputs this code if such a code is required to be inputted. This code is subsequently and newly acquired into the calculating unit either after the code is enlarged, or before the code is enlarged by the renormalizing means.

Embodiment 3

In this embodiment 3, usage of the SWTCH table 12 is enlarged, and an exponent "n" of power is set as a flag which indicates that probability of a state is the power of ½. One example is indicated in FIG. 12. In this example, 2 is set to such a SWTCH value under state of ¼ other than the probability of ½. Since such a set table is applied to both the encoding process flow operation and the decoding process flow operation indicated in the embodiment 1, in such a case that the value of the SWTCH 12 is equal to 1 at the steps S120', S130', and S220', such a value obtained by shifting the value of the A register 31 by "n" digits along the right direction is set to LSZ. As a result, it is possible to allocate the partial sections with less error, and therefore, to improve the encoding performance.

The above-described exponent is arbitrarily selectable. Even when the constant table is again set so as to increase/decrease a total number of the states, and further, a total state number of the power of ½ is increased/decreased in the probability corresponding thereto, there is no specific problem that there are plural sets of such states having the same probability. Also, in such a case that a probability prediction error is allowably contained in a portion of the state of the power whose probability is equal to ½, the value of the SWTCH 12 need not be set.

As previously described, in accordance with this third embodiment, since the specific value stored in the table is set to such a probability value which can be expressed by the power of ½, such a symbol whose appearance probability becomes the power of ½ can be discriminated from other symbols. As a consequence, the correction can be made with less error, while the approximate value is not applied.

Alternatively, the above-explained specific value may be stored in the table as such a positive integer value of an exponent of a binary decimal number in the case that this specific value is expressed by the power of ½. As a result, the storage capacity may be reduced, and also since such a value obtained by compressing the valid section by way of the shift-processing by the digit of the above-explained positive integer is used as the correction value of the first partial section, the correction value can be readily calculated by executing the shift process operation.

Alternatively, when the section width is updated, such a value obtained by compressing the valid section by way of the shift-processing only by the digit of the positive integer value may be used as the correction value of the first partial section. In this alternative case, the correction value may be easily calculated from the valid section width by way of the shift-processing. As a consequence, the process operation can be carried out in a simple manner, and in a high speed.

Embodiment 4

This embodiment 4 is featured by that similar to the embodiment 3, such a SWTCH table 12 is applied to the above-explained embodiment 2, in which the exponent part "n" is set with respect to the probability of the power of ½. In this embodiment 4, it is so assumed that the ENCODE process flow of FIG. 23, the RENORME process flow of FIG. 26, the DECODE process flow of FIG. 9, the LPS_EXCHANGE process flow of FIG. 10, the MPS_EXCHANGE process flow of FIG. 11, and also the RENORMD process flow of FIG. 30 are applied without any change.

Figure 13:
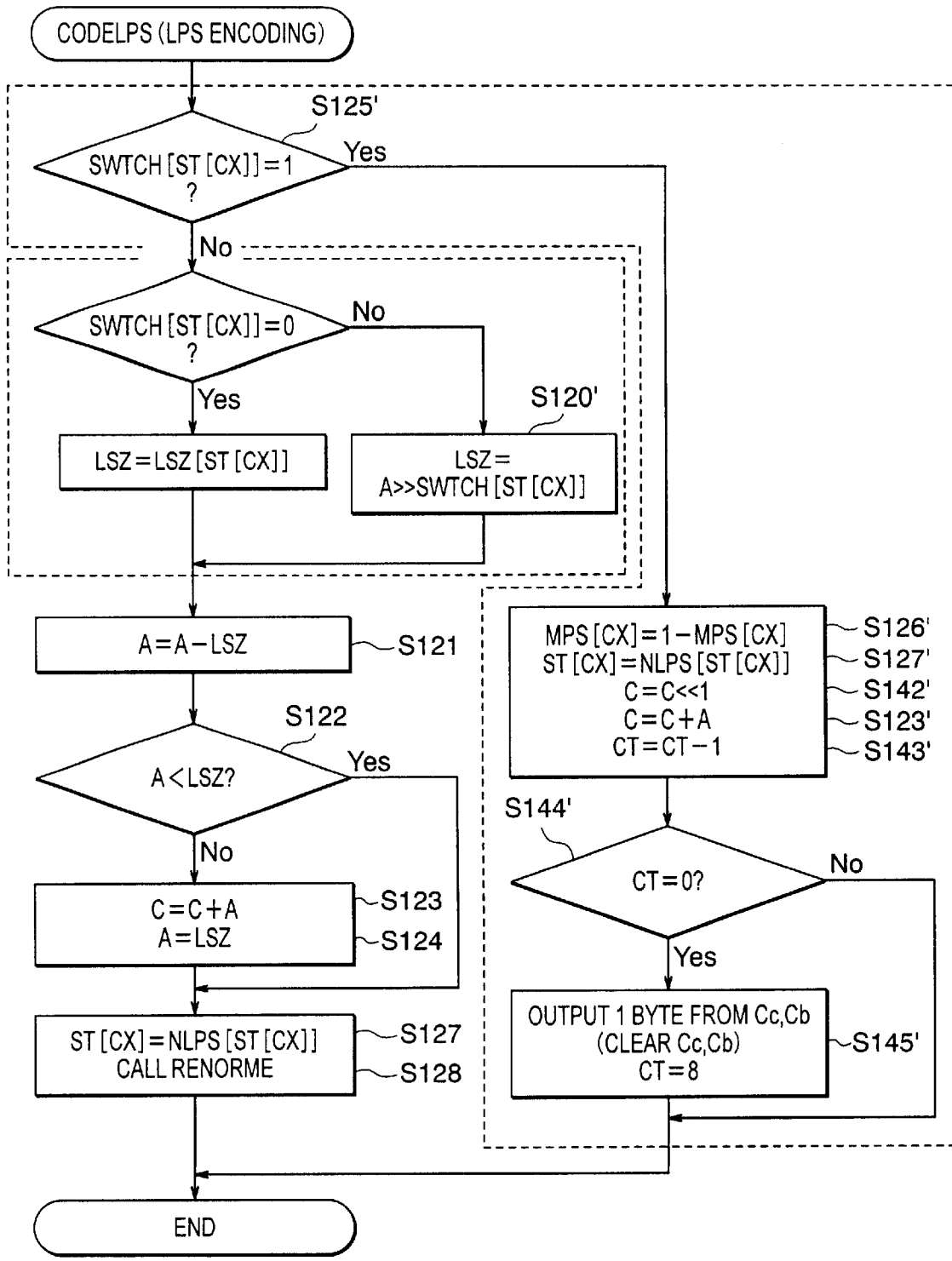
FIG. 13 is a flow chart for representing a CODELPS process flow operation according to an embodiment 4 of the present invention.

FIG. 13 is a flow chart for explaining a CODELPS process flow operation used to encode LPS. This process flow operation is realized by changing the step S120 of FIG. 6 into the step S120' of FIG. 3.

Figure 14:
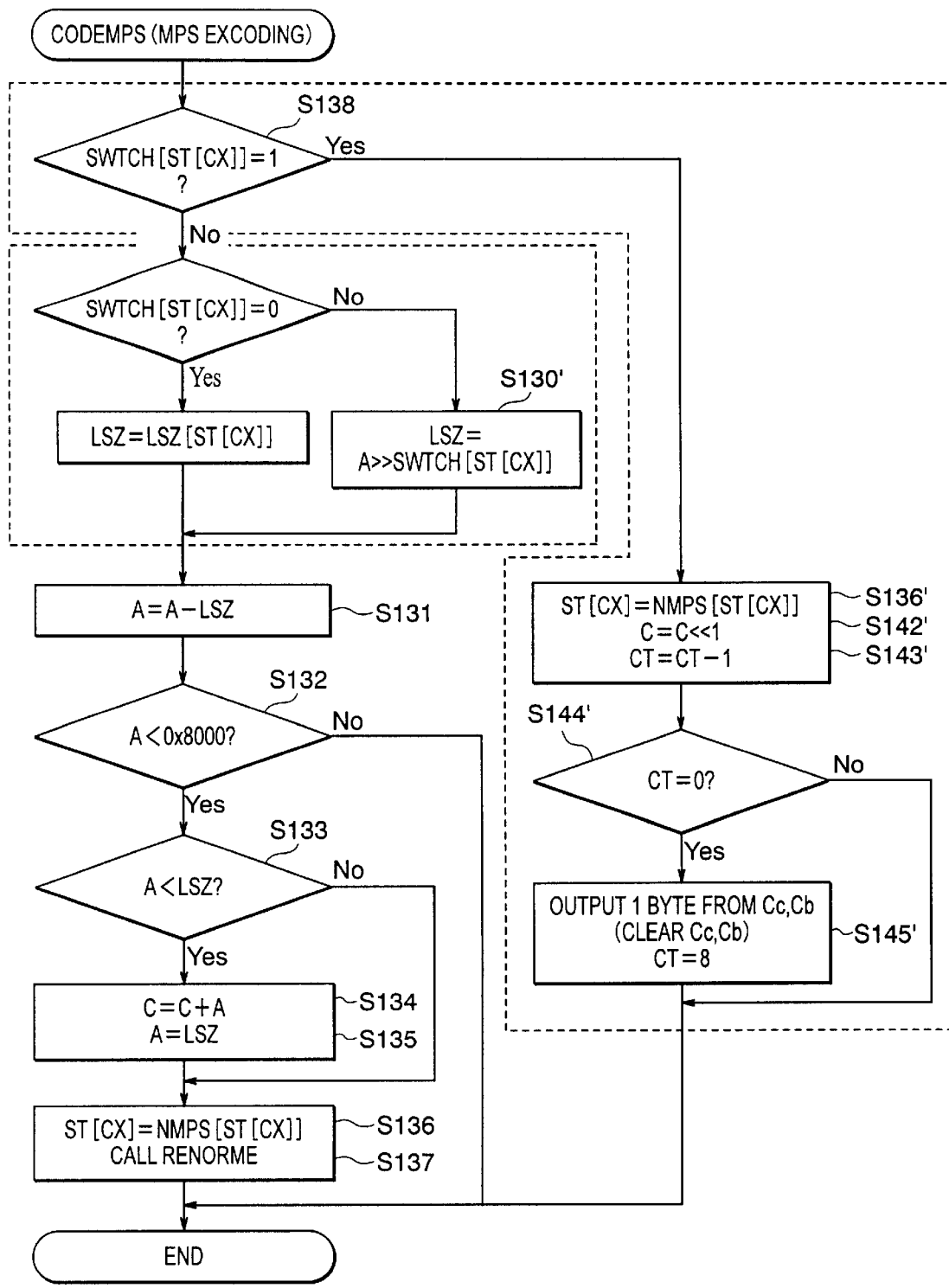
FIG. 14 is a flow chart for showing a CODEMPS process flow operation according to the embodiment 4 of the present invention.

FIG. 14 is a flow chart for explaining a CODEMPS process flow operation used to encode MPS. This process flow operation is realized by changing the step S130 of FIG. 7 into the step S130' of FIG. 4

Figure 15:
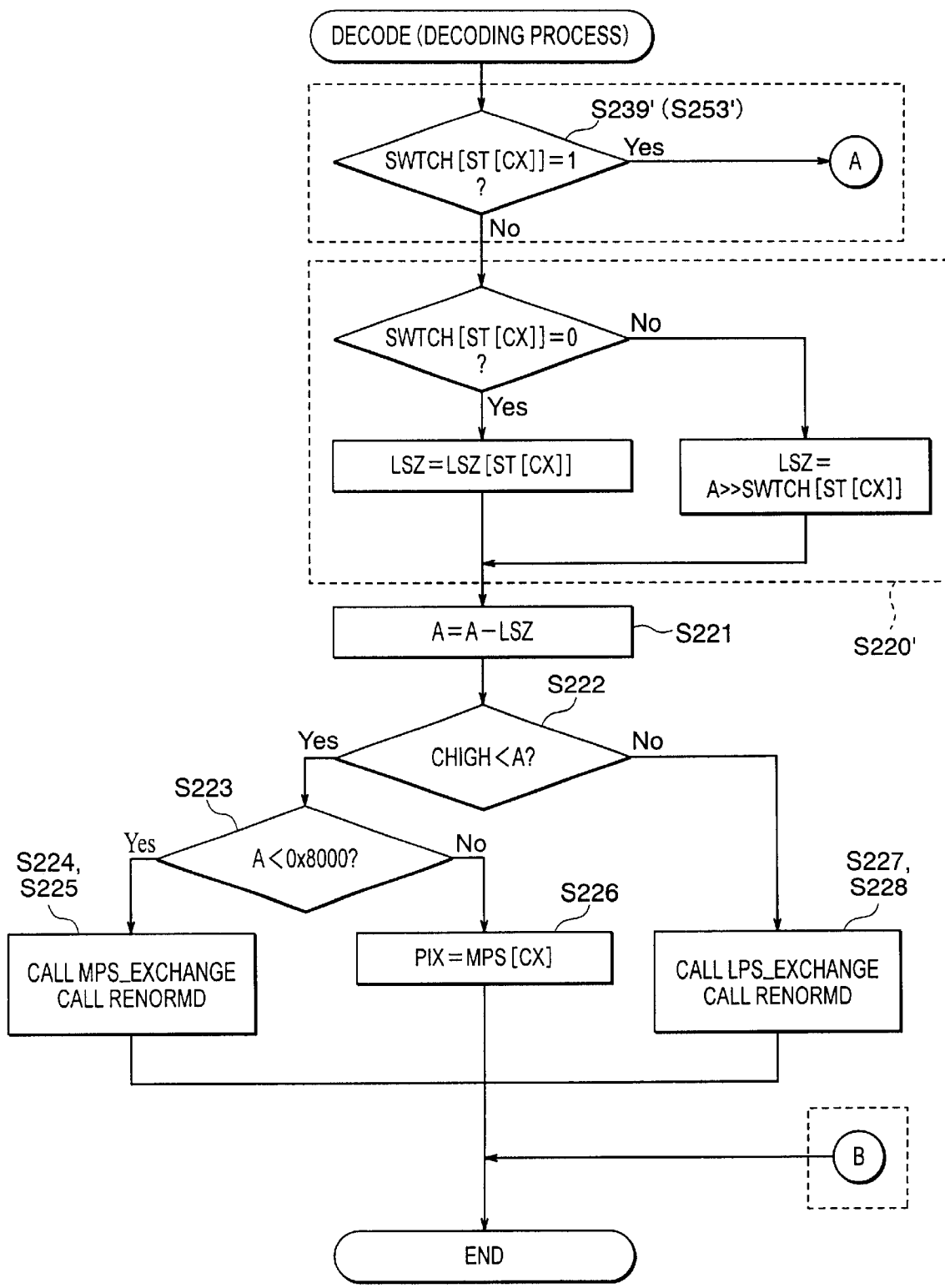
FIG. 15 is a flow chart for representing a DECODE process flow operation according to the embodiment 4 of the present invention.
Figure 16:
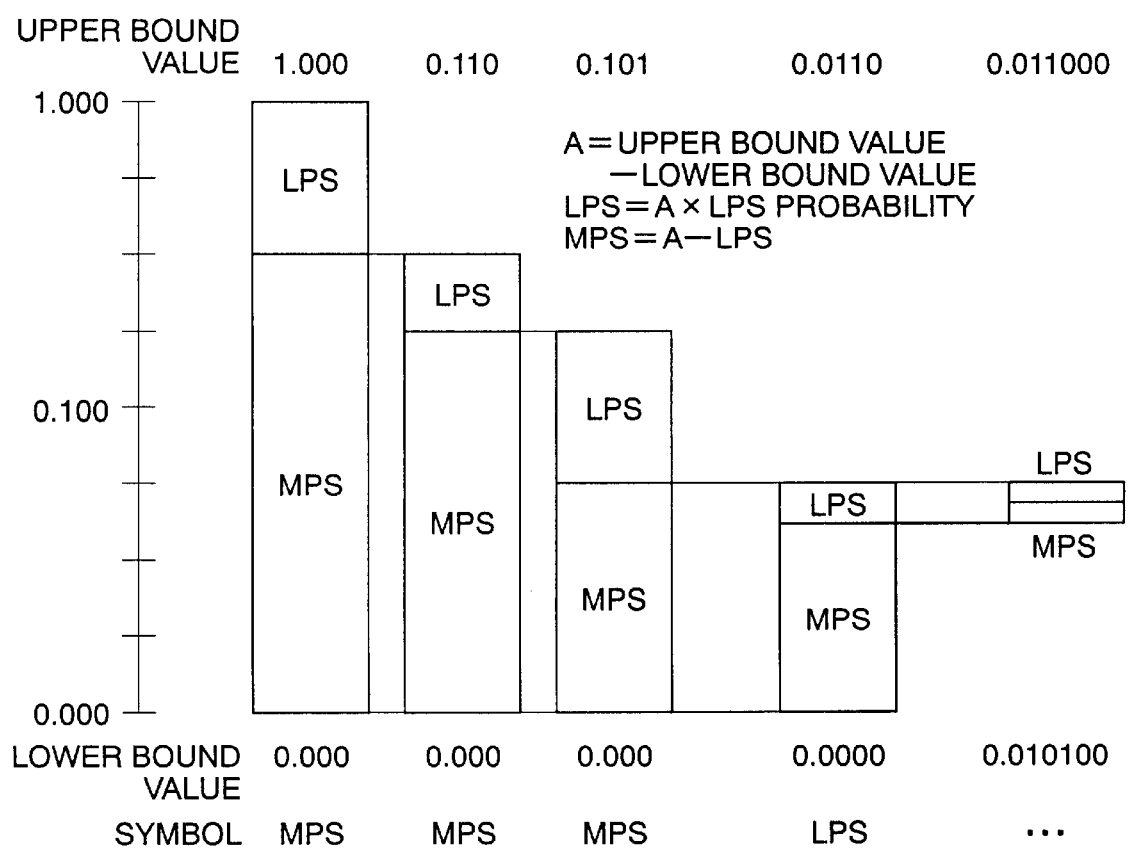
FIG. 16 is an explanatory diagram for explaining a conceptional idea of a binary arithmetic encoding operation.
Figure 17:
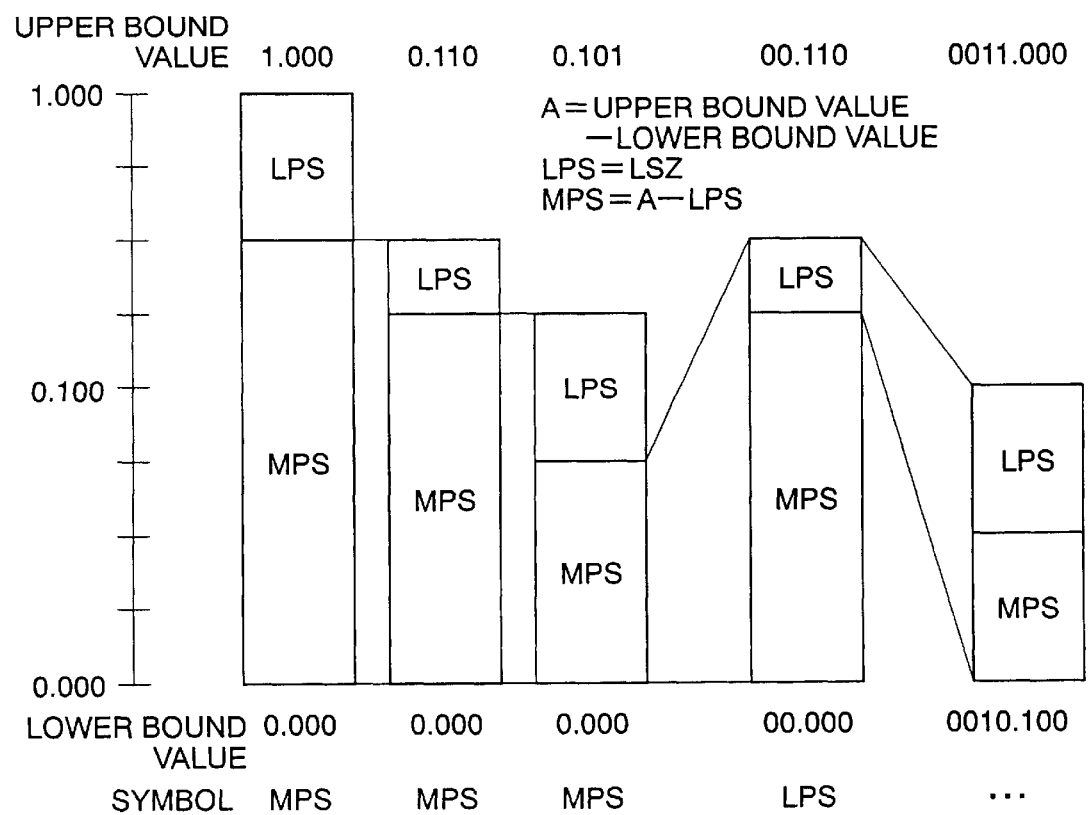
FIG. 17 is an explanatory diagram for explaining conceptional ideas as to by a subtraction type arithmetic encoding operation and a renormalizing process operation.

FIG. 15 is a flow chart for explaining a DECODE process flow operation used to decode a pixel which should be decoded. This process flow operation is realized by changing the step S220 of FIG. 8 into the step S220' of FIG. 5.

What is claimed is:

1. An encoding apparatus for predicting appearance probability of an information source symbol, while learning, and for dividing a valid section on a numerical straight line into both a first partial section to which an approximate value of said prediction appearance probability is applied and a second partial section remained in the valid section, to which such an arithmetic code is applied, said arithmetic code setting a partial section corresponding to an appearing symbol as a new valid section, comprising:

storage means for storing thereinto such a fact that said prediction appearance probability is a specific value;

judgement means for judging that said prediction appearance probability is equal to said specific value by referring to said specific value of said storage means; and correction means for correcting an allocation between said first partial section and said second partial section when said judgement means judges that said prediction appearance probability is equal to said specific value.

2. An encoding apparatus as claimed in claim 1 wherein:

one of said specific values stored in said storage means is selected to be ½; and a series of calculation process operations executed in combination with updating of a predicable symbol value of said prediction appearance probability with respect to the relevant symbol is independently constituted from a calculation process operation of an irrespective symbol.

3. An encoding apparatus as claimed in claim 2 wherein:

in encoding operation applied to said relevant symbol, said correction means corrects the allocation, while assuming that both said first partial section and said second partial section are made equal to said valid section; and said encoding apparatus further comprises:

renormalizing means by which only a code is enlarged by executing either a 1-digit shifting process operation or a multiplication by 2 without changing said valid section, and thereafter, representation precision of the valid section is kept maximum by a procedure for calculating a code value; and code outputting means for outputting such a code which can be outputted after the code has been updated by said renormalizing means.

4. An encoding apparatus as claimed in claim 1 wherein:

said specific value stored in said storage means is equal to a probability value expressed by power of ½.

5. An encoding apparatus as claimed in claim 4 wherein:

said storage means stores thereinto as said specific value, a positive integer value of an exponent part of a binary decimal number in the case that said specific value is expressed by said power of ½; and said judgement means judges that said prediction appearance possibility is equal to said specific value based upon said positive integer value.

6. An encoding apparatus as claimed in claim 5 wherein:

with respect to said positive integer value stored in said storage means, said correction means uses such a value obtained by compressing said valid section by way of a shift-processing operation only by said positive integer digit as a correction value of said first partial section.

7. A decoding apparatus for predicting appearance probability of an information source symbol, while learning, and for dividing a valid section on a numerical straight line into both a first partial section to which an approximate value of said prediction appearance probability is applied and a second partial section remained in the valid section, to which such an arithmetic code is applied, said arithmetic code setting a partial section corresponding to an appearing symbol as a new valid section, comprising:

storage means for storing thereinto such a fact that said prediction appearance probability is a specific value;

judgement means for judging that said prediction appearance probability is equal to said specific value by referring to said specific value of said storage means; and correction means for correcting an allocation between said first partial section and said second partial section when said judgement means judges that said prediction appearance probability is equal to said specific value.

8. A decoding apparatus as claimed in claim 7 wherein:

one of said specific values stored in said storage means is selected to be ½; and a series of calculation process operations executed in combination with updating of a predicable target symbol value of said prediction appearance probability with respect to the relevant symbol is independently constituted from a calculation process operation of an irrespective symbol.

9. A decoding apparatus as claimed in claim 8 wherein:

in decoding operation applied to said relevant symbol, said correction means corrects the allocation, while assuming that both said first partial section and said second partial section are made equal to said valid section; and said decoding apparatus further comprises:

renormalizing means by which only a code is enlarged by executing either a 1-digit shifting process operation or a multiplication by 2 without changing said valid section, and thereafter, representation precision of the valid section is kept maximum by a procedure for calculating a code value; and code inputting means by which after the code has been enlarged by said renormalizing means, and if a code which is newly and subsequently acquired by a calculating unit is required to be inputted, then said code is previously prepared so as to be inputted.

10. A decoding apparatus as claimed in claim 8 wherein:

in decoding operation applied to said relevant symbol, said correction means corrects the allocation, while assuming that both said first partial section and said second partial section are made equal to said valid section; and said decoding apparatus further comprises:

renormalizing means by which only a code is enlarged by executing either a 1-digit shifting process operation or a multiplication by 2 without changing said valid section, and thereafter, representation precision of the valid section is kept maximum by a procedure for calculating a code value; and code inputting means by which before the code is enlarged by said renormalizing means, and if such a code which is acquired to a calculating unit is required to be inputted, then said code is inputted.

11. A decoding apparatus as claimed in claim 7 wherein:

said specific value stored in said storage means is equal to a probability value which can be expressed by power of ½.

12. A decoding apparatus as claimed in claim 11 wherein:

said storage means stores thereinto as said specific value, a positive integer value of an exponent part of a binary decimal number in the case that said specific value is expressed by said power of ½; and said judgement means judges that said prediction appearance possibility is equal to said specific value based upon said positive integer value.

13. A decoding apparatus as claimed in claim 12 wherein:

with respect to said positive integer value stored in said storage means, said correction means uses such a value obtained by compressing said valid section by way of a shift-processing operation only by said positive integer digit as a correction value of said first partial section.

14. An encoding method for predicting appearance probability of an information source symbol, while learning, and for dividing a valid section on a numerical straight line into both a first partial section to which an approximate value of said prediction appearance probability is applied and a second partial section remained in the valid section, to which such an arithmetic code is applied, said arithmetic code setting a partial section corresponding to an appearing symbol as a new valid section, comprising:

a storage step for storing thereinto such a fact that said prediction appearance probability is a specific value;

a judgement step for judging that said prediction appearance probability is equal to said specific value by referring to said specific value stored in said storage step; and a correction step for correcting an allocation between said first partial section and said second partial section when said judgement means judges that said prediction appearance probability is equal to said specific value.

15. An encoding method as claimed in claim 14 wherein:

one of said specific values stored in said storage step is selected to be ½; and a series of calculation process operations executed in combination with updating of a predicable symbol value of said prediction appearance probability with respect to the relevant symbol is independently constituted from a calculation process operation of an irrespective symbol.

16. An encoding method as claimed in claim 15 wherein:

in encoding operation applied to said relevant symbol, said correction step corrects the allocation, while assuming that both said first partial section and said second partial section are made equal to said valid section; and said correction step is comprised of:

a renormalizing step by which only a code is enlarged by executing either a 1-digit shifting process operation or a multiplication by 2 without changing said valid section, and thereafter, representation precision of the valid section is kept maximum by a procedure for calculating a code value; and a code outputting step for outputting such a code which can be outputted after the code has been updated by said renormalizing step.

17. An encoding method as claimed in claim 14 wherein:

said specific value stored in said storage step is equal to a probability value which can be expressed by power of ½.

18. An encoding method as claimed in claim 17 wherein:

said storage step stores thereinto as said specific value, a positive integer value of an exponent part of a binary decimal number in the case that said specific value is expressed by said power of ½; and said judgement step judges that said prediction appearance possibility is equal to said specific value based upon said positive integer value.

19. An encoding method as claimed in claim 18 wherein:

with respect to said positive integer value stored in said storage step, said correction step uses such a value obtained by compressing said valid section by way of a shift-processing operation by said positive integer digit as a correction value of said first partial section.

20. A decoding method for predicting appearance probability of an information source symbol, while learning, and for dividing a valid section on a numerical straight line into both a first partial section to which an approximate value of said prediction appearance probability is applied and a second partial section remained in the valid section, to which such an arithmetic code is applied, said arithmetic code setting a partial section corresponding to an appearing symbol as a new valid section, comprising:

a storage step for storing thereinto such a fact that said prediction appearance probability is a specific value;

a judgement step for judging that said prediction appearance probability is equal to said specific value by referring to said specific value stored in said storage step; and a correction step for correcting an allocation between said first partial section and said second partial section when said judgement step judges that said prediction appearance probability is equal to said specific value.

21. A decoding method as claimed in claim 20 wherein:

one of said specific values stored in said storage step is selected to be ½; and a series of calculation process operations executed in combination with updating of a predicable target symbol value of said prediction appearance probability with respect to the relevant symbol is independently constituted from a calculation process operation of an irrespective symbol.

22. A decoding method as claimed in claim 21 wherein:

in decoding operation applied to said relevant symbol, said correction step corrects the allocation, while assuming that both said first partial section and said second partial section are made equal to said valid section; and said decoding method further comprising:

a renormalizing step by which only a code is enlarged by executing either a 1-digit shifting process operation or a multiplication by 2 without changing said valid section, and thereafter, representation precision of the valid section is kept maximum by a procedure for calculating a code value; and a code inputting step by which after the code has been enlarged by said renormalizing step, and if a code which is newly and subsequently acquired by a calculating unit is required to be inputted, then said code is previously prepared so as to be inputted.

23. A decoding method as claimed in claim 21 wherein:

in decoding operation applied to said relevant symbol, said correction step corrects the allocation, while assuming that both said first partial section and said second partial section are made equal to said valid section; and said decoding method further comprising:

a renormalizing step by which only a code is enlarged by executing either a 1-digit shifting process operation or a multiplication by 2 without changing said valid section, and thereafter, representation precision of the valid section is kept maximum by a procedure for calculating a code value; and a code inputting step by which before the code is enlarged by said renormalizing step, and if such a code which is acquired to a calculating unit is required to be inputted, then said code is inputted.

24. A decoding method as claimed in one of claims 20 to 23 wherein:

said specific value stored in said storage step is equal to a probability value which can be expressed by power of ½.

25. A decoding method as claimed in claim 24 wherein:

said storage step stores thereinto as said specific value, a positive integer value of an exponent part of a binary decimal number in the case that said specific value is expressed by said power of ½; and said judgement step judges that said prediction appearance possibility is equal to said specific value based upon said positive integer value.

26. A decoding method as claimed in claim 25 wherein:

with respect to said positive integer value stored in said storage step, said correction step uses such a value obtained by compressing said valid section by way of a shift-processing operation only by said positive integer digit as a correction value of said first partial section.

* * * * *